United States Patent
Yu et al.

(10) Patent No.: US 10,115,732 B2
(45) Date of Patent: Oct. 30, 2018

(54) THREE DIMENSIONAL MEMORY DEVICE CONTAINING DISCRETE SILICON NITRIDE CHARGE STORAGE REGIONS

(71) Applicant: SANDISK TECHNOLOGIES INC., Plano, TX (US)

(72) Inventors: Jixin Yu, Milpitas, CA (US); Zhenyu Lu, Milpitas, CA (US); Daxin Mao, Cupertino, CA (US); Yanli Zhang, San Jose, CA (US); Andrey Serov, Milpitas, CA (US); Chun Ge, Milpitas, CA (US); Johann Alsmeier, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/049,444

(22) Filed: Feb. 22, 2016

(65) Prior Publication Data

US 2017/0243879 A1    Aug. 24, 2017

(51) Int. Cl.
*H01L 29/792* (2006.01)
*H01L 21/336* (2006.01)
(Continued)

(52) U.S. Cl.
CPC .... *H01L 27/11582* (2013.01); *H01L 21/0214* (2013.01); *H01L 21/0223* (2013.01);
(Continued)

(58) Field of Classification Search
CPC ........... H01L 27/11582; H01L 27/1158; H01L 27/11578; H01L 29/7926
(Continued)

(56) References Cited

U.S. PATENT DOCUMENTS

| 5,915,167 A | 6/1999 | Leedy |
| 8,349,681 B2 | 1/2013 | Alsmeier et al. |

(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Fernando L Toledo
*Assistant Examiner* — Aaron Gray
(74) *Attorney, Agent, or Firm* — The Marbury Law Group PLLC

(57) ABSTRACT

Discrete silicon nitride portions can be formed at each level of electrically conductive layers in an alternating stack of insulating layers and the electrically conductive layers. The discrete silicon nitride portions can be employed as charge trapping material portions, each of which is laterally contacted by a tunneling dielectric portion on the front side, and by a blocking dielectric portion on the back side. The tunneling dielectric portions may be formed as discrete material portions or portions within a tunneling dielectric layer. The blocking dielectric portions may be formed as discrete material portions or portions within a blocking dielectric layer. The discrete silicon nitride portions can be formed by depositing a charge trapping material layer and selectively removing portions of the charge trapping material layer at levels of the insulating layers. Various schemes may be employed to singulate the charge trapping material layer.

17 Claims, 37 Drawing Sheets

(51) Int. Cl.
     H01L 27/11582    (2017.01)
     H01L 21/02       (2006.01)
     H01L 21/311      (2006.01)
     H01L 21/32       (2006.01)
     H01L 27/1157     (2017.01)

(52) U.S. Cl.
     CPC ........ *H01L 21/31111* (2013.01); *H01L 21/32* (2013.01); *H01L 27/1157* (2013.01); *H01L 29/7926* (2013.01)

(58) Field of Classification Search
     USPC .................. 257/324, E29.309; 438/268, 264
     See application file for complete search history.

(56) References Cited

U.S. PATENT DOCUMENTS

| 9,305,932 | B2 | 4/2016 | Kanakamedala et al. | |
| 2009/0230458 | A1* | 9/2009 | Ishiduki | H01L 27/11565 257/324 |
| 2011/0147824 | A1* | 6/2011 | Son | G11C 16/0483 257/324 |
| 2011/0294290 | A1* | 12/2011 | Nakanishi | H01L 27/11551 438/666 |
| 2012/0211822 | A1 | 8/2012 | Lim et al. | |
| 2014/0097484 | A1 | 4/2014 | Seol et al. | |
| 2014/0225181 | A1 | 8/2014 | Makala et al. | |
| 2016/0064532 | A1 | 3/2016 | Makala et al. | |
| 2016/0086972 | A1 | 3/2016 | Zhang et al. | |
| 2016/0225786 | A1* | 8/2016 | Lee | H01L 27/11582 |
| 2016/0293623 | A1* | 10/2016 | Simsek-Ege | H01L 27/11582 |
| 2017/0098659 | A1* | 4/2017 | Yoshimizu | H01L 27/11582 |

OTHER PUBLICATIONS

U.S. Appl. No. 15/012,082, filed Feb. 1, 2016, SanDisk Technologies Inc.

U.S. Appl. No. 15/158,954, filed May 19, 2016, SanDisk Technologies Inc.

International Search Report and Written Opinion from the International Searching Authority for International Application No. PCT/US2016/067881, dated May 17, 2017, 22 pages.

Invitation to Pay Additional Fees and Communication Relating to Results of the Partial International Search from the International Searching Authority for International Application No. PCT/US2016/067881, dated Mar. 23, 2017, 11 pages.

International Preliminary Report on Patentability and Written Opinion of the International Searching Authority for International Application No. PCT/US2016/067881, dated Sep. 7, 2018, 14 pages.

* cited by examiner

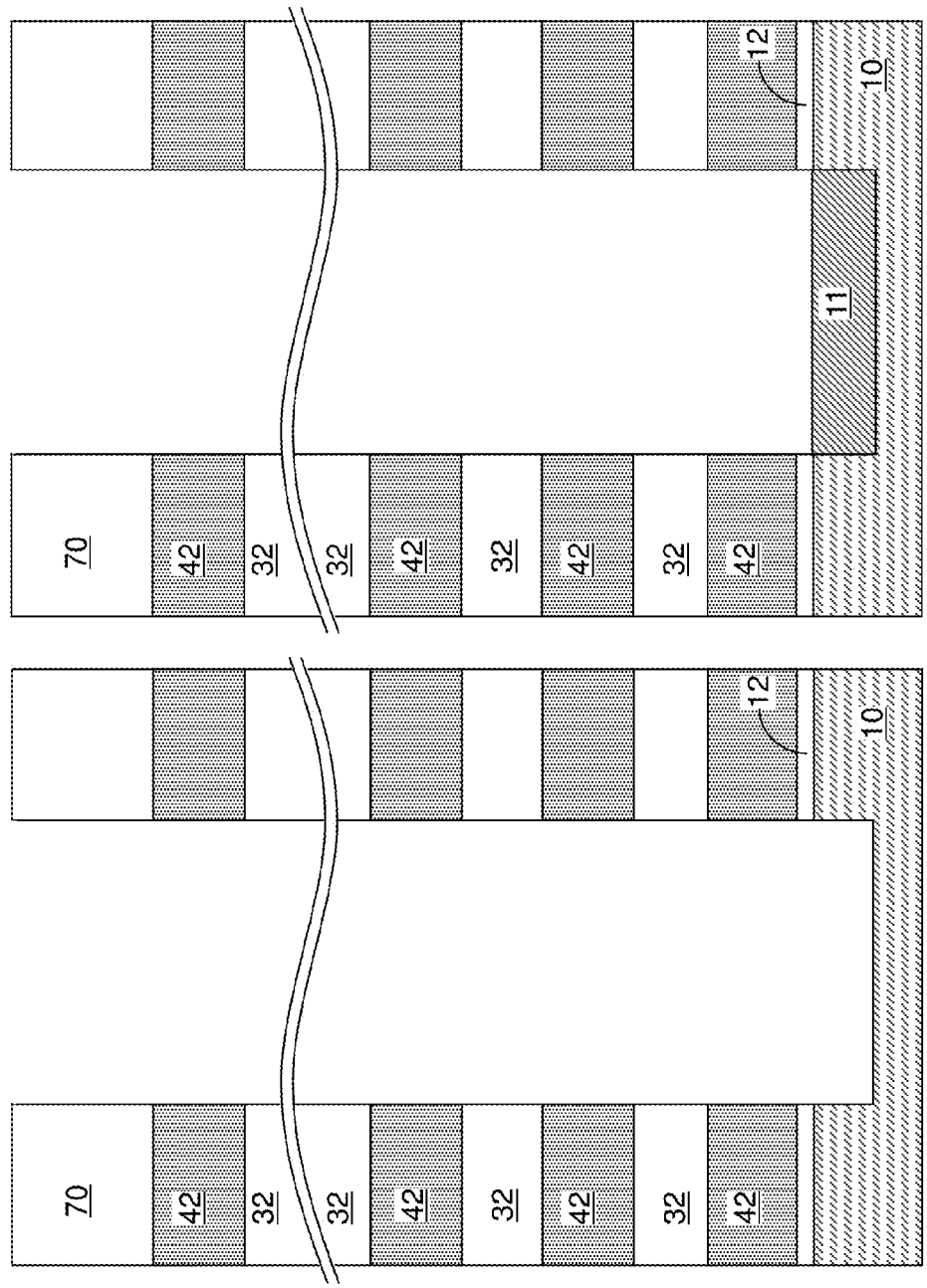

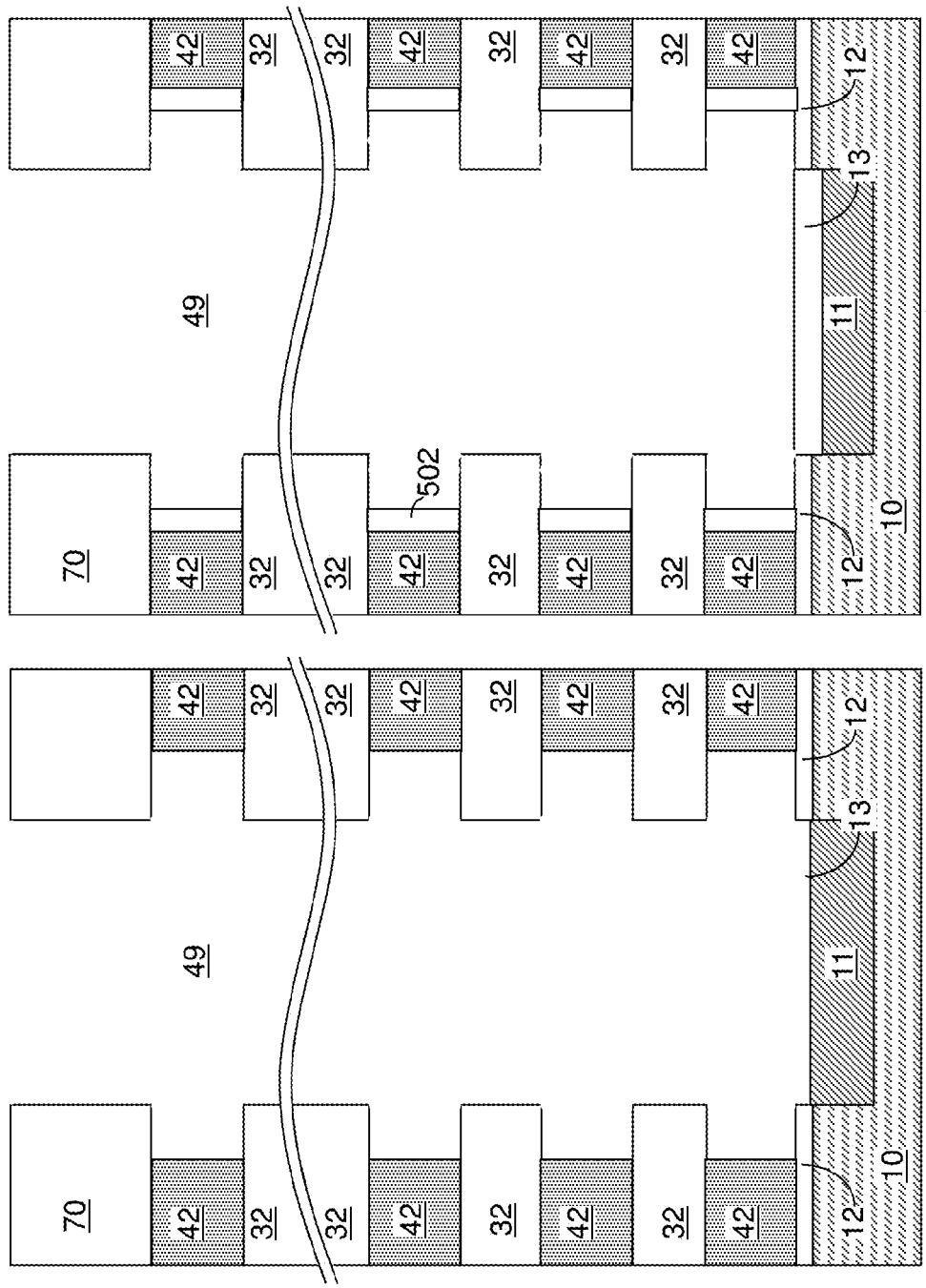

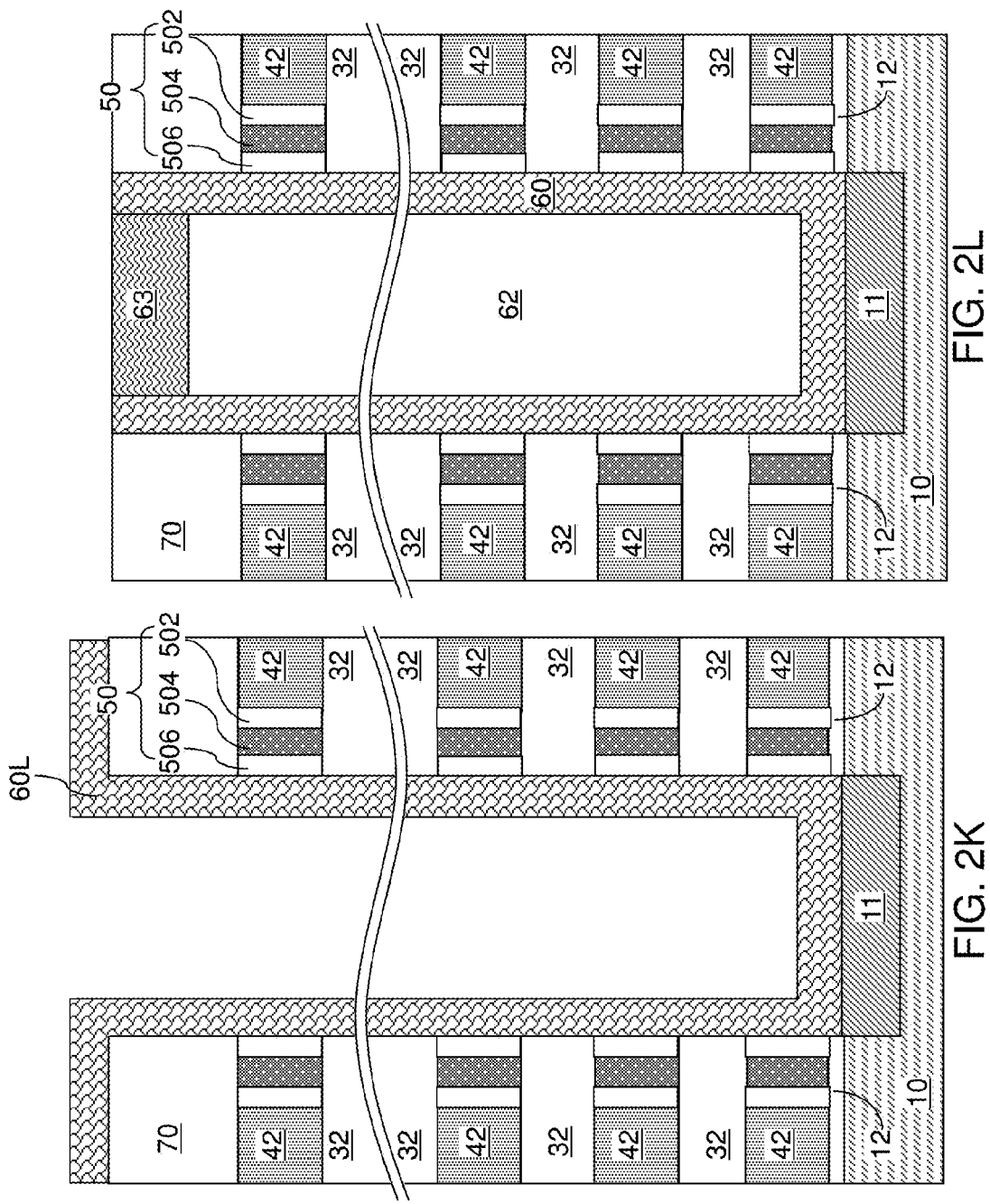

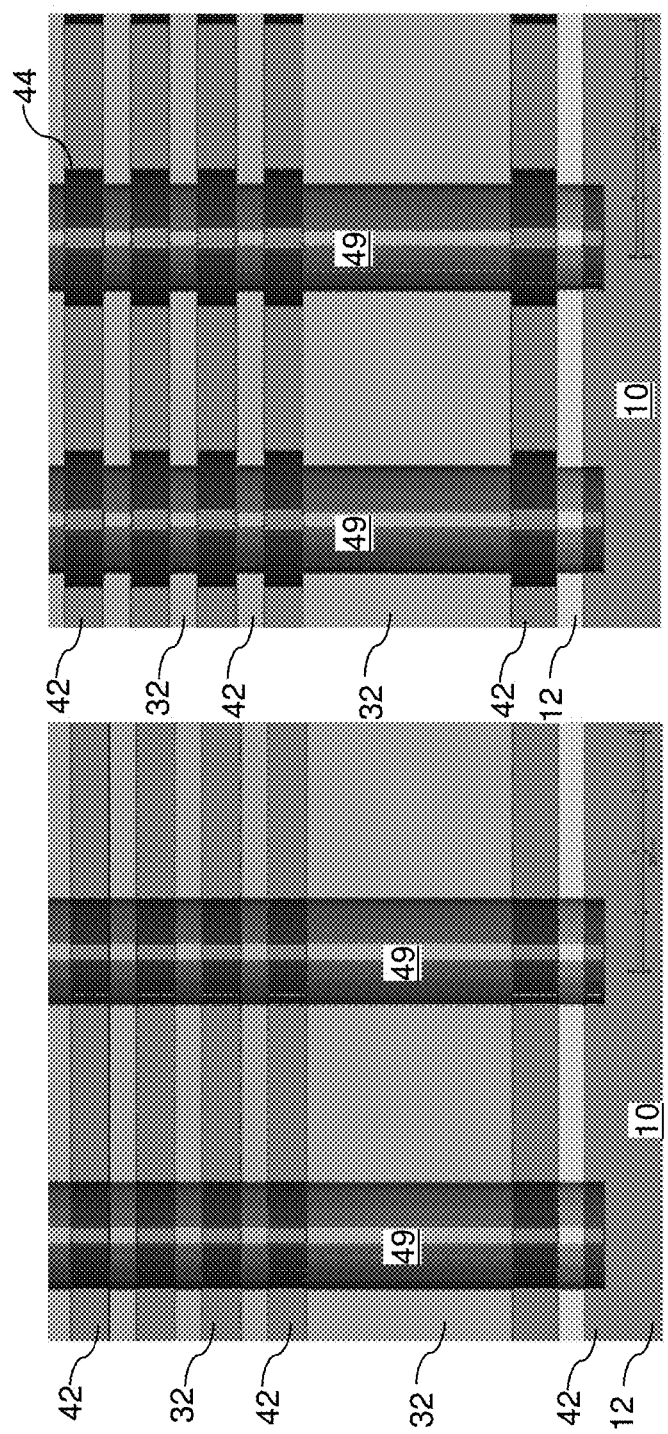

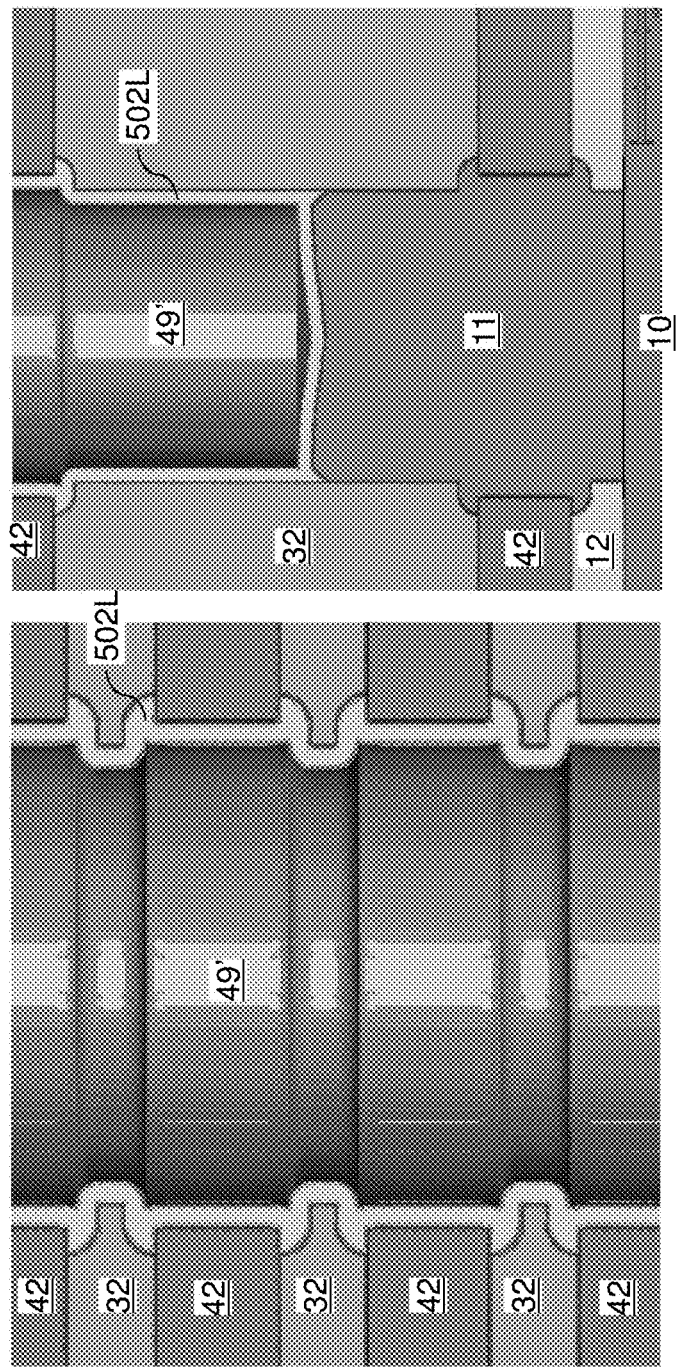

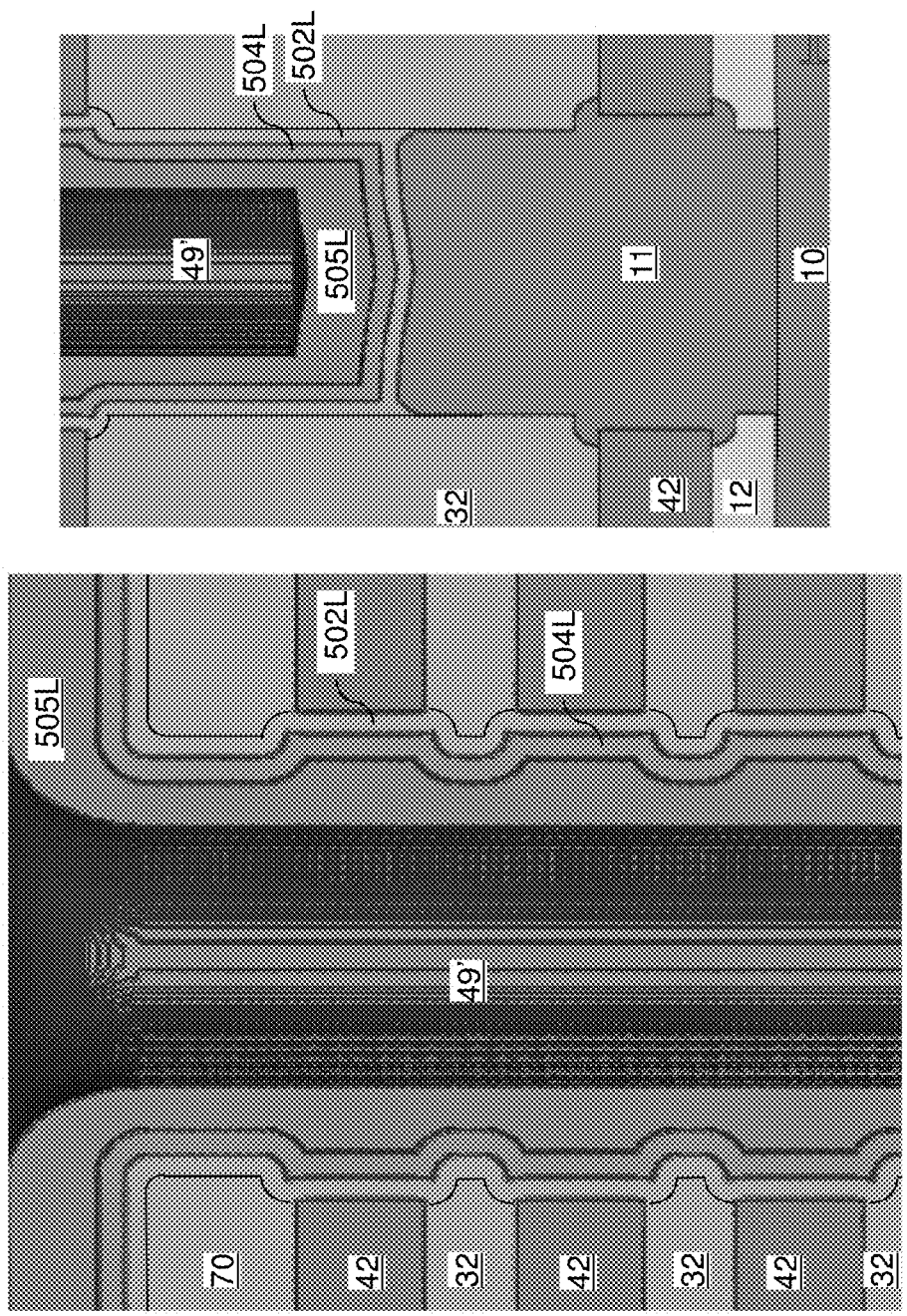

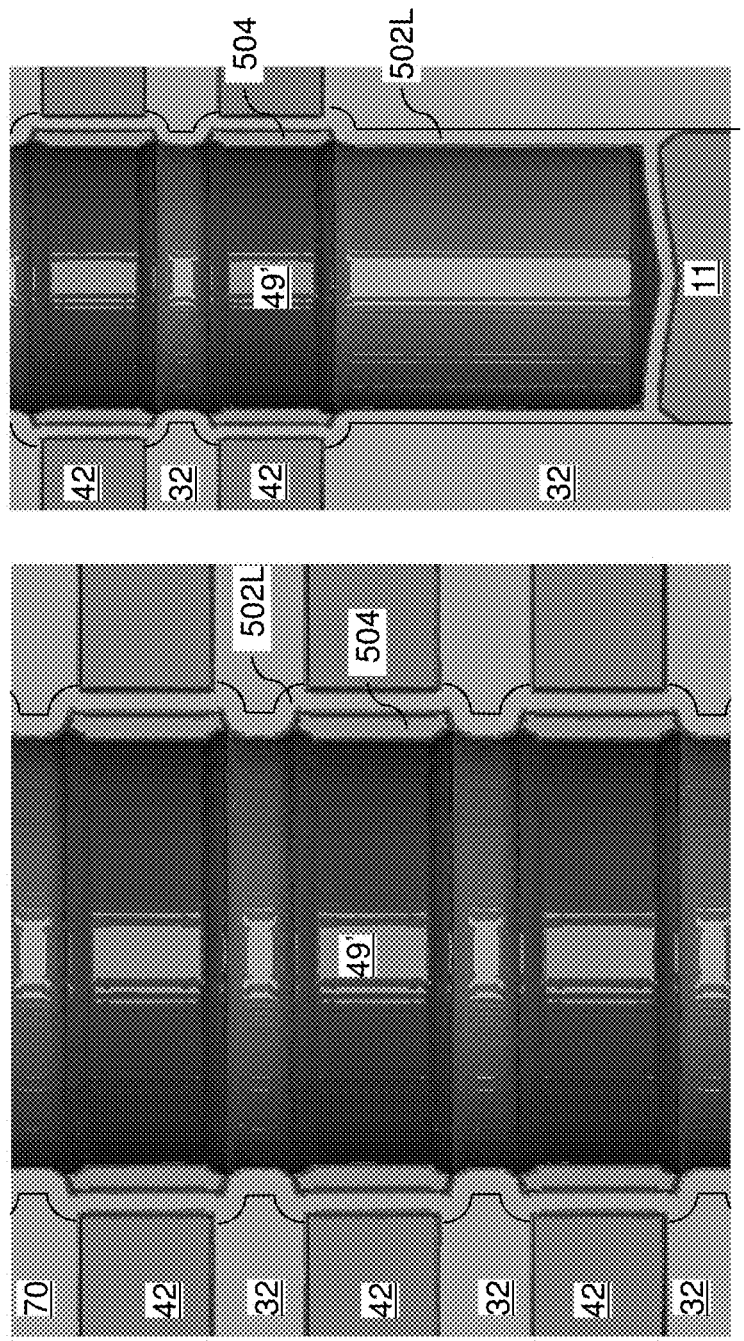

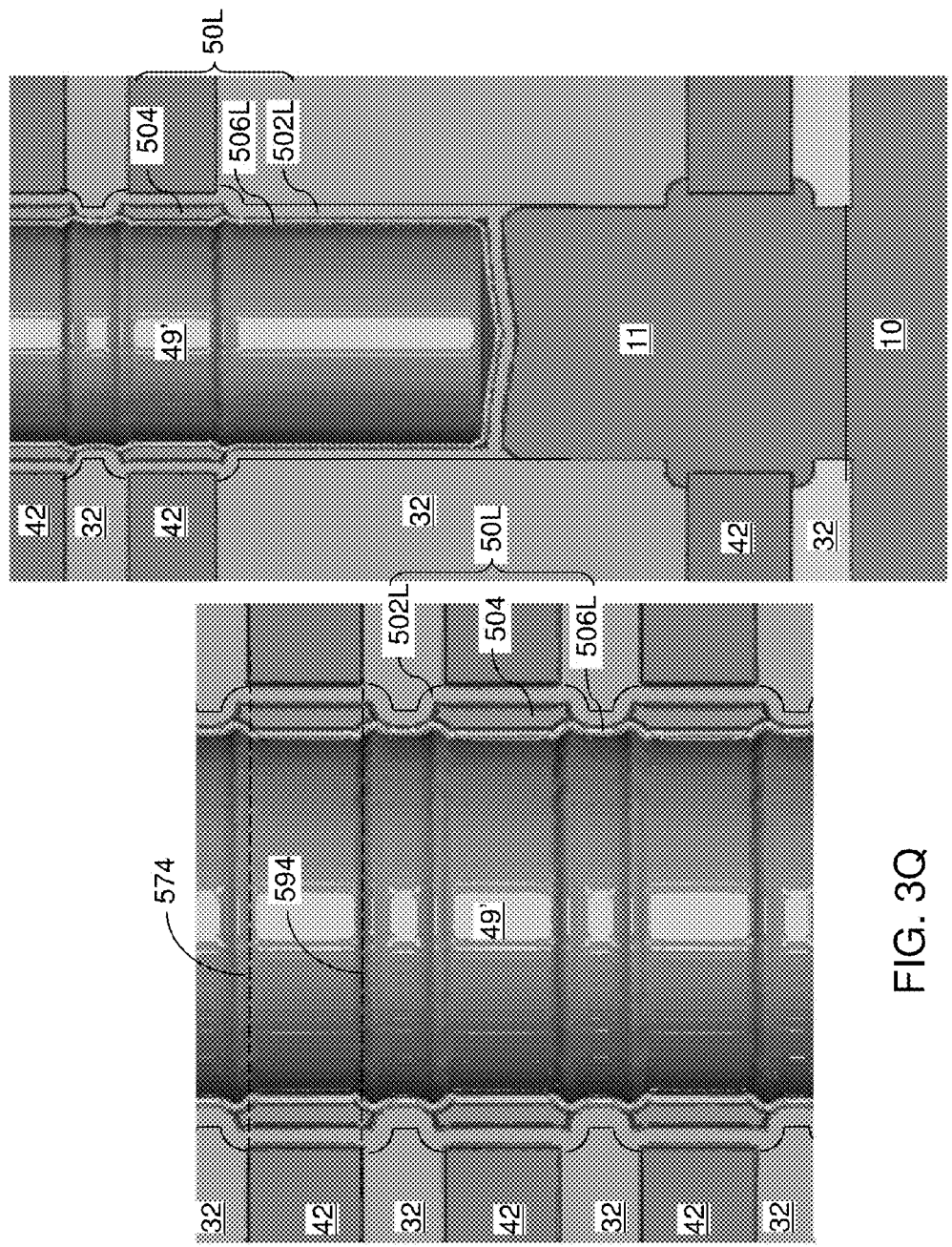

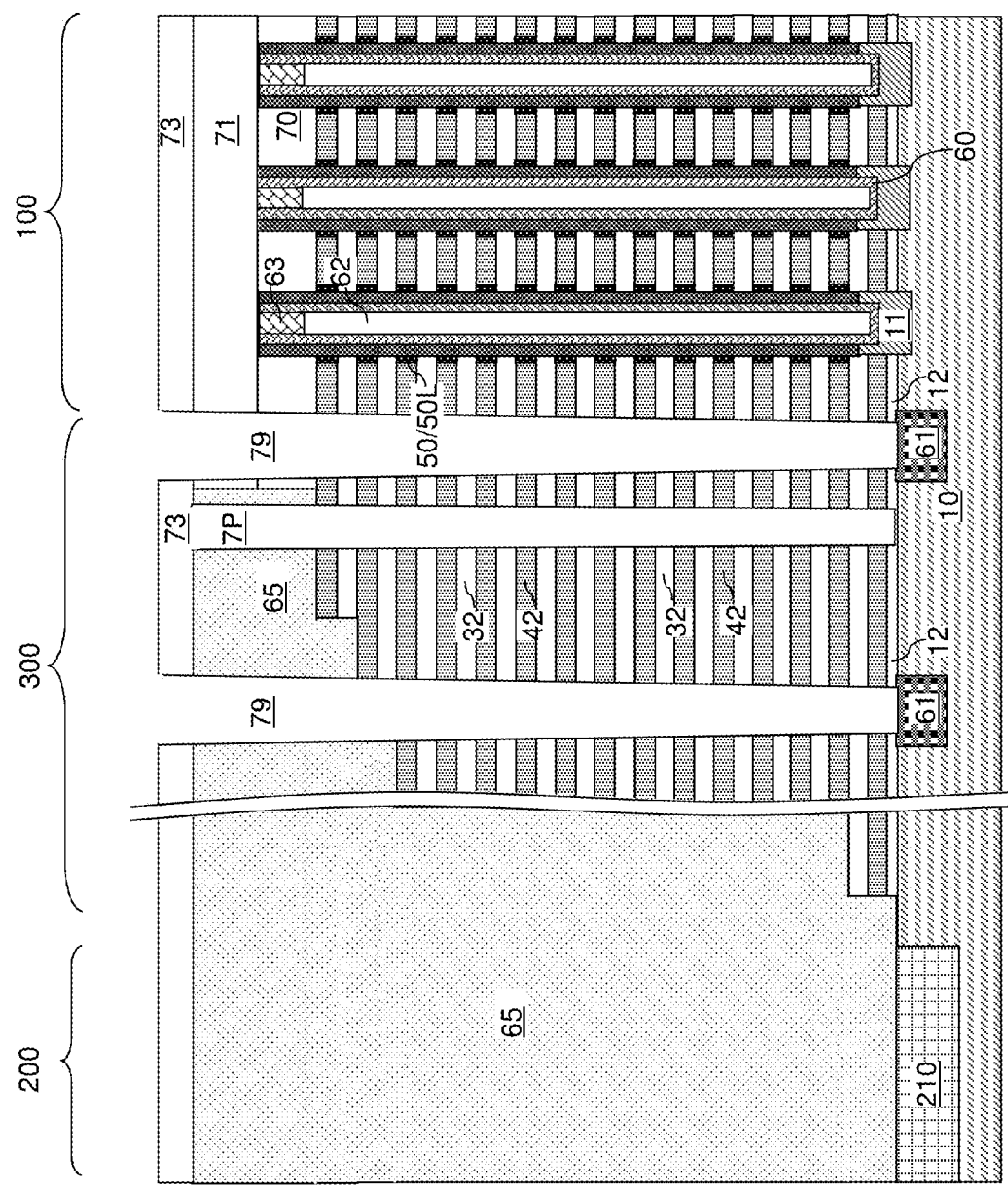

THREE DIMENSIONAL MEMORY DEVICE CONTAINING DISCRETE SILICON NITRIDE CHARGE STORAGE REGIONS

FIELD

The present disclosure relates generally to the field of semiconductor devices and specifically to three-dimensional memory devices, such as vertical NAND strings and other three-dimensional devices, and methods of making thereof.

BACKGROUND

Three-dimensional vertical NAND strings having one bit per cell are disclosed in an article by T. Endoh, et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a structure is provided, which comprises: an alternating stack of insulating layers and electrically conductive layers located over a substrate; and a memory stack structure extending through the alternating stack and comprising memory elements laterally surrounding a vertical semiconductor channel Each of the memory elements comprise, from outside to inside, a blocking dielectric portion, a charge trapping material portion comprising silicon nitride, and a tunneling dielectric portion. Each of the charge trapping material portions is vertically spaced from one another, and does not contact any other of the charge trapping material portions. Each of the tunneling dielectric portions is vertically spaced from one another, and does not contact any other of the tunneling dielectric portions.

According to another aspect of the present disclosure, a structure is provided, which comprises: an alternating stack of insulating layers and electrically conductive layers located over a substrate; and a memory stack structure extending through the alternating stack and comprising memory elements laterally surrounding a vertical semiconductor channel Each of the memory elements comprise, from outside to inside, a blocking dielectric portion, a charge trapping material portion comprising silicon nitride, and a tunneling dielectric portion. Each of the charge trapping material portions is vertically spaced from one another, and does not contact any other of the charge trapping material portions. Each of the charge trapping material portions has a greater vertical extent than a maximum vertical extent of an electrically conductive layer located at a same level.

According to yet another aspect of the present disclosure, a method of forming a semiconductor device is provided. An alternating stack of insulating layers and spacer material layers is formed over a substrate. A memory opening extending through the alternating stack is formed. A memory stack structure comprising memory elements is formed in the memory opening. Each of the memory elements comprise, from outside to inside, a blocking dielectric portion, a charge trapping material portion comprising silicon nitride, and a tunneling dielectric portion. Each of the charge trapping material portions is vertically spaced from one another, and does not contact any other of the charge trapping material portions. Each of the tunneling dielectric portions is vertically spaced from one another, and does not contact any other of the tunneling dielectric portions. A vertical semiconductor channel is formed inside the memory stack structure.

According to still another aspect of the present disclosure, a method of forming a semiconductor device is provided. An alternating stack of insulating layers and spacer material layers is formed over a substrate. A memory opening extending through the alternating stack is formed. A memory stack structure comprising memory elements is formed in the memory opening. Each of the memory elements comprise, from outside to inside, a blocking dielectric portion, a charge trapping material portion comprising silicon nitride, and a tunneling dielectric portion. Each of the charge trapping material portions is vertically spaced from one another, and does not contact any other of the charge trapping material portions. Each of the charge trapping material portions has a greater vertical extent than a maximum vertical extent of an electrically conductive layer located at a same level. A vertical semiconductor channel is formed inside the memory stack structure.

BRIEF DESCRIPTION OF THE DRAWINGS

FIG. 2A is a vertical cross-sectional view of a memory opening of the exemplary structure as formed according to the first embodiment of the present disclosure.

FIG. 2B is a vertical cross-sectional view of the memory opening of the exemplary structure after formation of an epitaxial channel portion according to the first embodiment of the present disclosure.

FIG. 2C is a vertical cross-sectional view of the memory opening after lateral recessing of the sacrificial material layers according to the first embodiment of the present disclosure.

FIG. 2D is a vertical cross-sectional view of the memory opening after formation of discrete blocking dielectric portions according to the first embodiment of the present disclosure.

FIG. 2K is a vertical cross-sectional view of the memory opening after formation of a semiconductor channel layer according to the first embodiment of the present disclosure.

FIG. 2L is a vertical cross-sectional view of the memory opening after formation of a vertical semiconductor channel, a dielectric core, and a drain region according to the first embodiment of the present disclosure.

FIG. 3A is a vertical cross-sectional view of a memory opening as formed according to a second embodiment of the present disclosure. The inside of the memory opening has variable shading depending on the material composition on sidewalls of the memory opening.

FIG. 3B is a vertical cross-sectional view of the memory opening after lateral recessing of the sacrificial material layers according to the second embodiment of the present disclosure.

FIG. 3F is a vertical cross-sectional view of the memory opening after formation of a blocking dielectric layer according to the second embodiment of the present disclosure.

FIG. 3G is a vertical cross-sectional view of the bottom portion of the memory opening of FIG. 3F.

FIG. 3J is a vertical cross-sectional view of the memory opening after formation of a masking material layer according to the second embodiment of the present disclosure.

FIG. 3K is a vertical cross-sectional view of the bottom portion of the memory opening of FIG. 3J.

FIG. 3O is a vertical cross-sectional view of the memory opening after removal of the masking material portions according to the second embodiment of the present disclosure.

FIG. 3P is a vertical cross-sectional view of the bottom portion of the memory opening of FIG. 3O.

FIG. 3Q is a vertical cross-sectional view of the memory opening after formation of a tunneling dielectric layer according to the second embodiment of the present disclosure.

FIG. 3R is a vertical cross-sectional view of the bottom portion of the memory opening of FIG. 3Q.

FIG. 7A is a vertical cross-sectional view of the first or second exemplary structure after formation of backside trenches according to an embodiment of the present disclosure.

DETAILED DESCRIPTION

Figure 1:
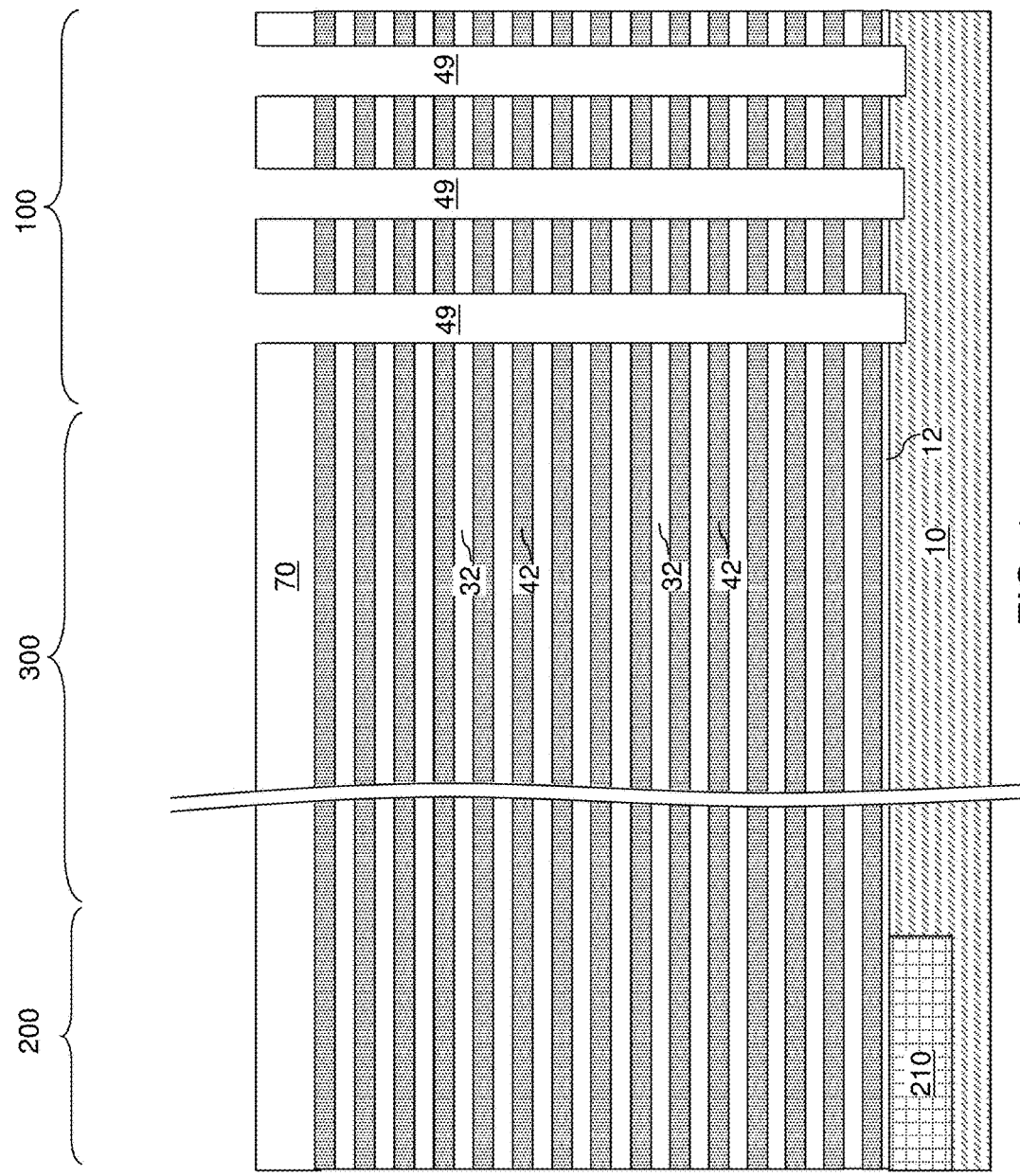
FIG. 1 is a vertical cross-sectional view of an exemplary structure after formation of an alternating stack of insulating layers and sacrificial material layers and memory openings extending through the alternating stack according to a first embodiment of the present disclosure.

As discussed above, the present disclosure is directed to three-dimensional memory devices, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the structure. For example, a layer may be located between any pair of horizontal planes between, or at, a top surface and a bottom surface of the structure. A layer may extend horizontally, vertically, and/or along a tapered surface. A substrate may be a layer, may include one or more layers therein, and/or may have one or more layer thereupon, thereabove, and/or therebelow.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor. A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to a first embodiment of the present disclosure is illustrated, which can be employed, for example, to fabricate a device structure containing vertical NAND memory devices. The exemplary structure includes a substrate, which can be a semiconductor substrate (e.g., a semiconductor substrate, such as a single crystalline silicon wafer). The substrate can include a semiconductor substrate layer 10. The semiconductor substrate layer 10 is a semiconductor material layer, and can include at least one elemental semiconductor material (e.g., silicon, such as single crystalline silicon), at least one III-V compound semiconductor material, at least one II-VI compound semiconductor material, at least one organic semiconductor material, or other semiconductor materials known in the art.

As used herein, a "semiconductor material" refers to a material having electrical conductivity in the range from $1.0 \times 10^{-6}$ S/cm to $1.0 \times 10^5$ S/cm, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulating material" or a "dielectric material" refers to a material having electrical conductivity less than $1.0 \times 10^{-6}$ S/cm. All measurements for electrical conductivities are made at the standard condition. The semiconductor substrate layer 10 can include at least one doped well (not expressly shown) having a substantially uniform dopant concentration therein.

The exemplary structure can have multiple regions for building different types of devices. Such areas can include, for example, a device region 100, a contact region 300, and a peripheral device region 200. In one embodiment, the semiconductor substrate layer 10 can include at least one a doped well in the device region 100. As used herein, a "doped well" refers to a portion of a semiconductor material having a doping of a same conductivity type (which can be p-type or n-type) and a substantially same level of dopant concentration throughout. The doped well can be the same as the semiconductor substrate layer 10 or can be a portion of the semiconductor substrate layer 10. The conductivity type of the doped well is herein referred to as a first conductivity type, which can be p-type or n-type. The dopant concentration level of the doped well is herein referred to as a first dopant concentration level. In one embodiment, the first dopant concentration level can be in a range from $1.0 \times 10^{15}/cm^3$ to $1.0 \times 10^{18}/cm^3$, although lesser and greater dopant concentration levels can also be employed. As used herein, a dopant concentration level refers to average dopant concentration for a given region.

Peripheral devices 210 can be formed in, or on, a portion of the semiconductor substrate layer 10 located within the peripheral device region 200. The peripheral devices can include various devices employed to operate the memory devices to be formed in the device region 100, and can include, for example, driver circuits for the various components of the memory devices. The peripheral devices 210 can include, for example, field effect transistors and/or passive components such as resistors, capacitors, inductors, diodes, etc.

Optionally, a gate dielectric layer 12 can be formed above the semiconductor substrate layer 10. The gate dielectric layer 12 can be employed as the gate dielectric for a first source select gate electrode. The gate dielectric layer 12 can include, for example, silicon oxide and/or a dielectric metal oxide (such as $HfO_2$, $ZrO_2$, $LaO_2$, etc.). The thickness of the gate dielectric layer 12 can be in a range from 3 nm to 30 nm, although lesser and greater thicknesses can also be employed.

An alternating stack of first material layers (which can be insulating layers 32) and second material layers (which are referred to spacer material layers) is formed over the top surface of the substrate, which can be, for example, on the top surface of the gate dielectric layer 12. As used herein, a "material layer" refers to a layer including a material throughout the entirety thereof. As used herein, a "spacer material layer" refers to a material layer that is located between two other material layers, i.e., between an overlying material layer and an underlying material layer. The spacer material layers can be formed as electrically conductive layers, or can be replaced with electrically conductive layers in a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer 42. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon oxynitride in which oxygen atoms are the predominant non-silicon atoms, organosilicate glass (OSG), and spin-on dielectric oxide materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

In another embodiment, the insulating layers 32 can include silicon oxide, and sacrificial material layers 42 can include a semiconductor material such as polysilicon, amorphous silicon, a silicon-germanium alloy, or a compound semiconductor material. The semiconductor material of the sacrificial material layers 42 formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the top surface of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

A lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form first memory openings 49. In other words, the transfer of the pattern in the patterned lithographic material stack through the alternating stack (32, 42) forms the first memory openings that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the gate dielectric layer 12 may be used as an etch stop layer between the alternating stack (32, 42) and the substrate. The sidewalls of the first memory openings can be substantially vertical, or can be tapered. The patterned lithographic material stack can be subsequently removed, for example, by ashing.

A memory stack structure can be formed in each of the memory opening. FIGS. 2A-2L illustrate sequential vertical cross-sectional views of a memory opening during formation of a first exemplary memory stack structure according to a first embodiment of the present disclosure. Formation of the first exemplary memory stack structure can be performed within each of the memory openings 49 in the exemplary structure illustrated in FIG. 1.

Referring to FIG. 2A, a memory opening 49 of the exemplary structure as formed after the processing steps of FIG. 1 is illustrated. The memory opening 49 extends through the insulating cap layer 70, the alternating stack (32, 42), and the gate dielectric layer 12, and optionally into an upper portion of the semiconductor substrate layer 10. The recess depth of the bottom surface of each memory opening 49 with respect to the top surface of the semiconductor substrate layer 10 can be in a range from 0 nm to 30 nm, although greater recess depths can also be employed.

Referring to FIG. 2B, an epitaxial channel portion 11 can be optionally formed at the bottom of each memory opening 49 by selective epitaxy of a semiconductor material. During the selective epitaxy process, a reactant gas and an etchant gas can be simultaneously or alternatively flowed into a process chamber. Semiconductor surfaces and dielectric surfaces of the exemplary structure provide different nucleation rates for the semiconductor material. By setting the etch rate (determined by the flow of the etchant gas) of the semiconductor material greater than the nucleation rate of the semiconductor material on the dielectric surfaces and less than the nucleation rate of the semiconductor material on the semiconductor surfaces, the semiconductor material can grow from the physically exposed semiconductor surfaces (i.e., from the physically exposed surfaces of the semiconductor substrate layer 10 at the bottom of each memory opening 49). Each portion of the deposited semiconductor material constitutes an epitaxial channel portion 11, which comprises a single crystalline semiconductor material (e.g., single crystalline silicon) in epitaxial alignment with the single crystalline semiconductor material (e.g., single crystalline silicon) of the semiconductor substrate layer 10. Each epitaxial channel portion 11 functions as a portion of a channel of a vertical field effect transistor. The top surface of the epitaxial channel portion 11 can be between a pair of sacrificial material layers 42. In other words, a periphery of each epitaxial channel portion 11 can be in physical contact with a sidewall of an insulating layer 32. A cavity 49' is present over an epitaxial channel portion 11 in each memory opening 49.

Referring to FIG. 2C, a selective etch process can be optionally performed to laterally recess the sacrificial material layers 42 relative to sidewall surfaces of the insulating layers 32 around each memory opening 49 to form lateral recesses (i.e., recessed regions) 44 in the memory opening 49. An isotropic etch or an anisotropic etch can be employed. In an illustrative example, the sacrificial material layers 42 can include silicon nitride, the gate dielectric layers 12 can include a dielectric metal oxide material, the insulating material layers 32 can include silicon oxide, and a wet etch employing hot phosphoric acid can be employed. The lateral recess 44 distance can be in a range from 4 nm to 20 nm (such as from 6 nm to 12 nm), although lesser and greater lateral recess distances can also be employed. In one embodiment, the sidewall surfaces of the sacrificial material layers 42 can be laterally recessed outward by the same lateral recess distance from the sidewall surfaces of the insulating layers 32 in the memory opening 49.

Referring to FIG. 2D, an oxidation process is performed to convert surface portions of the spacer material layers exposed in the lateral recesses 44 (i.e., the sacrificial material layers 42) into blocking dielectric portions 502. The oxidation process can include a thermal oxidation process and/or a plasma oxidation process (e.g., an in-situ steam generation, "ISSG", oxidation). If the sacrificial material layers 42 comprise silicon nitride, the blocking dielectric portions 502 can include silicon oxynitride or silicon oxide. If the sacrificial material layers 42 comprise a semiconductor material, the blocking dielectric portions 502 can include a dielectric oxide of the semiconductor material (such as silicon oxide). The thickness of each blocking dielectric portion 502 (as measured between an inner sidewall and an outer sidewall) can be in a range from 1 nm to 6 nm, although lesser and greater thicknesses can also be employed. Preferably, the thickness of each blocking dielectric portion 502 is less than the thickness of the lateral recesses (i.e., the recessed regions) 44 such that a portion of the lateral recesses 44 remains unfilled. During the oxidation process, a surface portion of the semiconductor material underlying a semiconductor surface at the bottom of each memory opening 49 can be converted into a horizontal semiconductor oxide portion 13 by oxidizing the semiconductor material underlying the semiconductor surface. If an epitaxial channel portion 11 is present at the bottom of each memory opening 49, a top portion of the epitaxial channel portion 11 can be converted into the horizontal semiconductor oxide portion 13 by an oxidation process. For example, if the epitaxial channel portion 11 includes single crystalline silicon, the horizontal semiconductor oxide portion 13 can include silicon oxide. The oxidation process can be a thermal oxidation process or a plasma oxidation process. The thickness of the horizontal semiconductor oxide portion 13 can be in a range from 2 nm to 30 nm (such as from 3 nm to 10 nm), although lesser and greater thicknesses can also be employed. The blocking dielectric portions 502 can be formed as discrete material portions located at each level of the spacer material layers (i.e., the sacrificial material layers 42) and can be vertically spaced from one another by the insulating layers 32. Each blocking dielectric portion 502 can be formed as an annular structure, i.e., a ring-shaped structure.

Alternatively, a continuous blocking dielectric layer (not illustrated) may be formed in lieu of, or in addition to, the blocking dielectric portions 502. In this case, a conformal deposition process can be employed to deposit the continuous blocking dielectric layer. The continuous blocking dielectric layer includes a dielectric material such as silicon oxide and/or aluminum oxide. The thickness of the continuous blocking dielectric layer may be in a range from 1 nm to 6 nm, although lesser and greater thicknesses can also be employed.

Figure 2E:
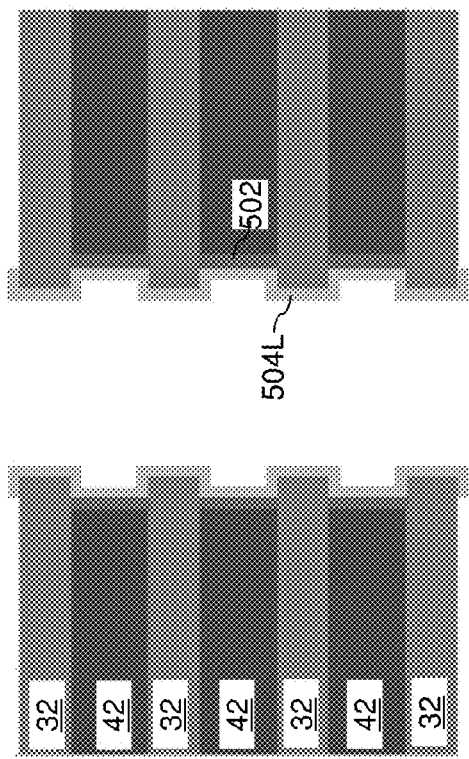
FIG. 2E is a vertical cross-sectional view of the memory opening after formation of a charge trapping material layer according to the first embodiment of the present disclosure.

Referring to FIG. 2E, a charge trapping material layer 504L can be formed on the sidewalls of the insulating layers 32 and in remaining portions of the lateral recesses 44. The insulating layers 32 are located over the inner sidewalls of the blocking dielectric portions 502. The charge trapping material layer 504L includes a charge trapping material. In one embodiment, the charge trapping material layer 504L can include a charge trapping dielectric material such as silicon nitride. The charge trapping material layer 504L can be formed as a single continuous material layer by a conformal deposition process such as chemical vapor deposition (CVD) or atomic layer deposition (ALD). The thickness of the charge trapping material layer 504L can be in a range from 2 nm to 5 nm, although lesser and greater thicknesses can also be employed. Due to the recessing of the inner sidewalls of the blocking dielectric portions 502 with respect to sidewalls of the insulating layers 32, the charge trapping material layer 504L laterally undulates inward toward a geometrical center of the memory opening at each level of the insulating layers 32 and undulates outward from the geometrical center of the memory opening at each level of the sacrificial material layers 42. Thus, a portion of layer 504L is located in the lateral recesses 44, but preferably does not completely fill the lateral recesses 44.

Figure 2F:
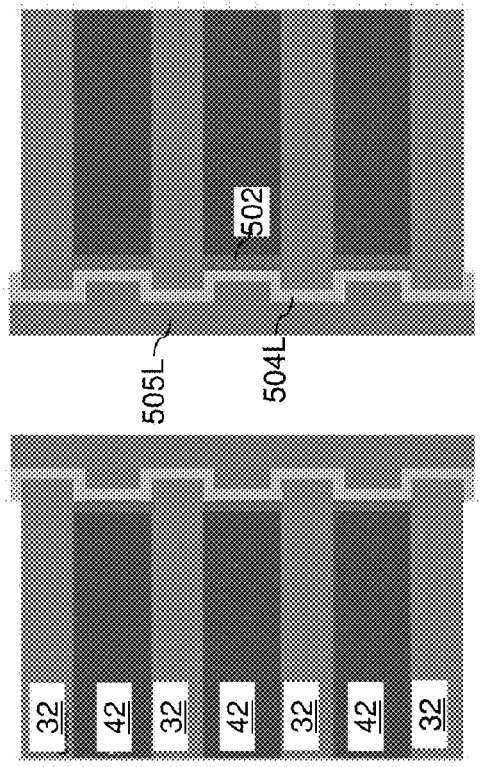
FIG. 2F is a vertical cross-sectional view of the memory opening after formation of a masking material layer according to the first embodiment of the present disclosure.

Referring to FIG. 2F, a masking material layer 505L can be deposited over layer 504L and over the sidewalls of the insulating layers 32 and the inner sidewalls of the blocking dielectric portions 502. The masking material layer 505L can include any material that can be employed as an etch mask for the material of the charge trapping material layer 504L. For example, if the charge trapping material layer 504L includes silicon nitride, the masking material layer 505L can include polysilicon, amorphous silicon, diamond-like carbon (DLC), amorphous carbon, or organic or inorganic polymer. In one embodiment, the thickness of the masking material layer 505L can be selected such that lateral recesses defined by the outwardly undulating inner sidewall of the charge trapping material layer 504L at each level of the blocking dielectric portions 502 are filled with the masking material layer 505L. For example, the lateral thickness of the masking material layer 505L as measured at levels of the insulating layers 32 can be greater than the width of the remaining portion of the lateral recesses 44, and can be greater than one half of the height of the sacrificial material layers 42 so that the lateral recesses at each level of the blocking dielectric portions 502 are filled with the masking material layer 505L. In this case, the inner sidewall of the masking material layer 505L in the memory opening 49 can be substantially vertical. Optionally, an anisotropic etch may be performed to provide a substantially vertical inner sidewall for the masking material layer 505L.

Figure 2G:
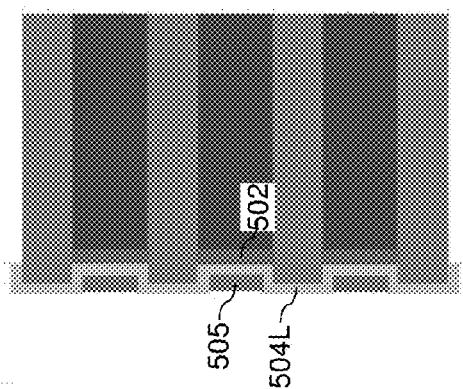
FIG. 2G is a vertical cross-sectional view of the memory opening after patterning the masking material layer into masking material portions according to the first embodiment of the present disclosure.

Referring to FIG. 2G, an anisotropic etch or an isotropic etch is performed to remove portions of the masking material layer 505L that protrude inward from a horizontally curved vertical plane (which may be a substantially cylindrical vertical plane) that includes innermost surfaces of the charge trapping material layer 504L. In case an anisotropic etch process is employed, the charge trapping material layer 504L can be employed as an etch mask layer for the anisotropic etch. Alternatively, an isotropic etch (e.g., a sacrificial polysilicon wet etch) can be employed such that the portions of the masking material layer 505L at levels of the insulating layers 32 are removed. Remaining portions of the masking material layer 505L in the lateral recesses 44 at levels of the spacer material layers (i.e., the sacrificial material layers 42) constitute masking material portions 505.

Figure 2H:
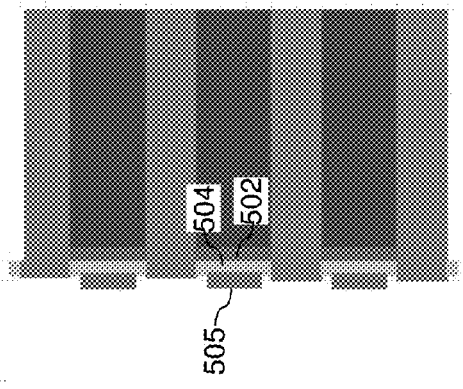
FIG. 2H is a vertical cross-sectional view of the memory opening after patterning the charge trapping material layer into discrete in-process charge trapping material portions according to the first embodiment of the present disclosure.

Referring to FIG. 2H, an etchant that etches the material of the charge trapping material layer 504L selective to the masking material portions 505 is introduced to remove physically exposed portions of the charge trapping material layer 504L. Portions of the charge trapping material layer 504L that are not covered by the masking material portions 505 are removed by the selective etch process. Remaining portions of the charge trapping material layer 504L in the lateral recesses 44 constitute charge trapping material portions 504. In one embodiment, the charge trapping material portions 504 include silicon nitride. In an illustrative example, the etchant can be hot phosphoric acid applied in a wet etch process. The charge trapping material portions 504 can be formed entirely within recesses at the levels of the sacrificial material layer 42.

Figure 2I:
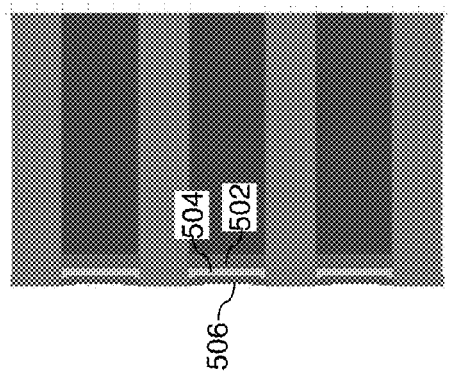
FIG. 2I is a vertical cross-sectional view of the memory opening after removal of the masking material portions according to the first embodiment of the present disclosure.
Figure 2I:
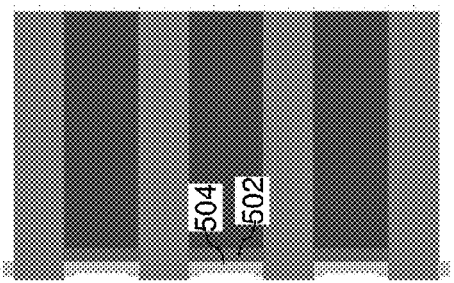

Referring to FIG. 2I, an etchant that removes the material of the masking material portions 505 selective to the material of the charge trapping material portions 504 is applied to remove the masking material portions 505. In an illustrative example, if the charge trapping material portions 504 includes silicon nitride and if the masking material portions 505 includes polysilicon, a selective wet etch employing KOH can be employed to remove the masking material portions 505 selective to the charge trapping material portions 504. The charge trapping material portions 504 are in-process charge trapping material portions, which are subsequently modified. In one embodiment, the charge trapping material portions 504 can include silicon nitride and can be located entirely in the recessed regions (i.e., in the lateral recesses) 44 at the levels of the sacrificial material layers 42. In an embodiment, portions 504 are thicker at their top and bottom than at their middle. However, this difference in thickness can be minimized to form portions which have roughly rectangular vertical cross sectional shapes.

Figure 2J:
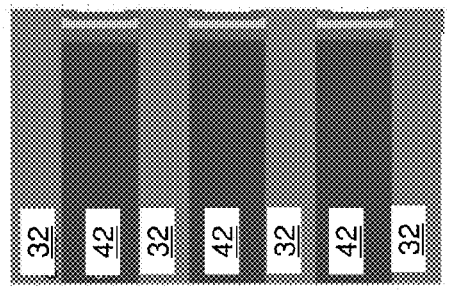
FIG. 2J is a vertical cross-sectional view of the memory opening after conversion of surface portions of the in-process charge trapping material portions into tunneling dielectric portions according to the first embodiment of the present disclosure.
Figure 2J:
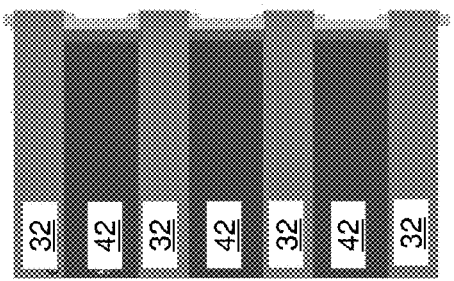

Referring to FIG. 2J, inner portions (which are surface portions) exposed in the memory opening 49 of the in-process charge trapping material portions 504 can be converted into the tunneling dielectric portions 506 by an oxidation process (e.g., thermal or plasma oxidation, such as ISSG oxidation). Remaining portions of the in-process charge trapping material portions 504 constitute the charge trapping material portions 504. The thickness of each tunneling dielectric portion 506 can be in a range from 1 nm to 4 nm (such as 1.5 nm to 3 nm), although lesser and greater thicknesses can also be employed. Each portion 506 may comprise silicon nitride or silicon oxynitride in the recessed regions 44.

Referring to FIG. 2K, the horizontal semiconductor oxide portion 13 (shown in FIG. 2D) can be removed by an anisotropic etch, which can be a reactive ion etch. In one embodiment, the anisotropic etch can be selective to the semiconductor material of the epitaxial channel portion 11 which is used as an etch stop. Portions 506 and 504 in the recessed regions 44 are protected from the anisotropic etch. A semiconductor channel layer 60L can be formed in the memory opening 49 by conformal deposition of a semiconductor material. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed.

A vertical stack of annular memory elements 50 is formed in each memory opening 49. Each annular memory element 50 includes, from outside to inside, a blocking dielectric portion 502, a charge trapping material portion 504 comprising silicon nitride, and a tunneling dielectric portion 506. Each annular memory element 50 is located at the level of a sacrificial material layer 42, and is vertically spaced from one another. Particularly, the charge trapping material portions 504 are vertically spaced from one another, and each portion 504 does not contact any other of the charge trapping material portions 504.

Referring to FIG. 2L, a dielectric fill material is deposited within the cavity inside the semiconductor channel layer 60L to fill the cavity. The dielectric fill material can include, for example, silicon oxide. The dielectric fill material can be removed from above the top surface of the insulating cap layer 70 by a planarization process such as a recess etch or chemical mechanical planarization. Subsequently, the dielectric fill material can be recessed so that the top surface of the remaining dielectric fill material is between a first horizontal plane including the bottom surface of the insulating cap layer 70 and the top surface of the insulating cap layer 70. The horizontal portion of the semiconductor channel layer 60L can be removed from above the insulating cap layer 70 by an etch process, which can be an anisotropic etch or an isotropic etch. Each remaining portion of the dielectric fill material in a memory opening 49 constitutes a dielectric core. Each remaining portion of the semiconductor channel layer 60L in a memory opening 49 constitutes a vertical semiconductor channel 60, which is a vertical portion of a semiconductor channel including the vertical semiconductor channel 60, an epitaxial channel portion 11 (if present), and a horizontal semiconductor channel (not expressly shown), which is a horizontal portion of the semiconductor substrate layer 10. The vertical semiconductor channel 60 is formed inside a memory stack structure 50. The annular memory elements 50 and the vertical semiconductor channel 60 within a memory opening collectively constitute a memory stack structure. Thus, the charge trapping material portions 504 (i.e., the discrete charge storage regions) are isolated between neighboring cells (i.e., between adjacent control gates) in the vertical direction perpendicular to the top substrate surface. This reduces or prevents data retention degradation due to vertical charge diffusions between adjacent cells in a device with a continuous charge storage (i.e., charge trapping) layer.

FIGS. 3A-3R illustrate sequential vertical cross-sectional views of a memory opening during formation of a second exemplary memory stack structure according to a second embodiment of the present disclosure. Formation of the second exemplary memory stack structure can be performed within each of the memory openings 49 in the exemplary structure illustrated in FIG. 1.

Referring to FIG. 3A, a memory opening 49 of the exemplary structure as formed after the processing steps of FIG. 1 is illustrated. The memory opening 49 of FIG. 3A can be the same as the memory opening 49 of FIG. 2A.

Referring to FIG. 3B, the processing steps of FIG. 2C can be performed to form recessed regions (which are lateral recesses) 44 at each level of the sacrificial material layers 42. In one embodiment, the distance of the lateral recess, i.e., the lateral distance between a sidewall of a laterally recessed sacrificial material layer 42 and a sidewall of an adjoining insulating layer 32 can be less than the thickness of the adjoining insulating layer 32.

Figure 3D:
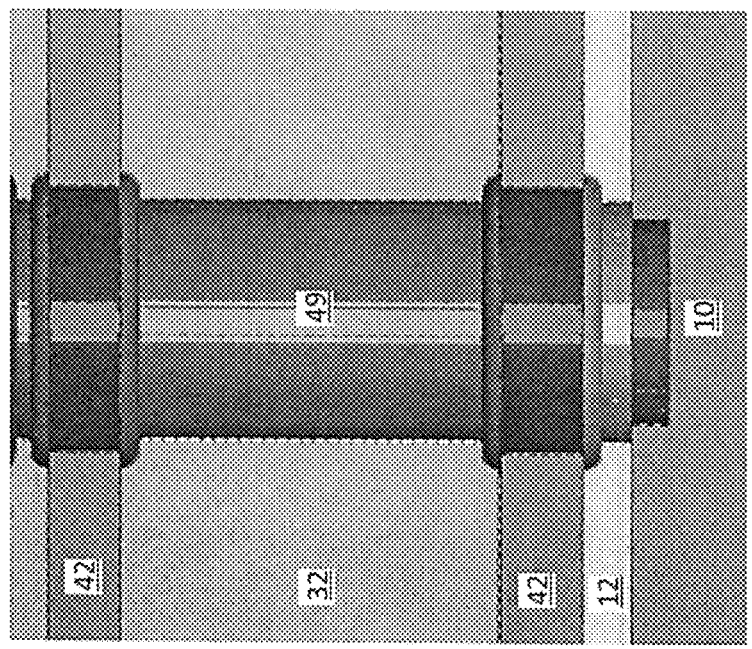
FIG. 3D is a vertical cross-sectional view of a bottom portion of the memory opening of FIG. 3C.
Figure 3C:
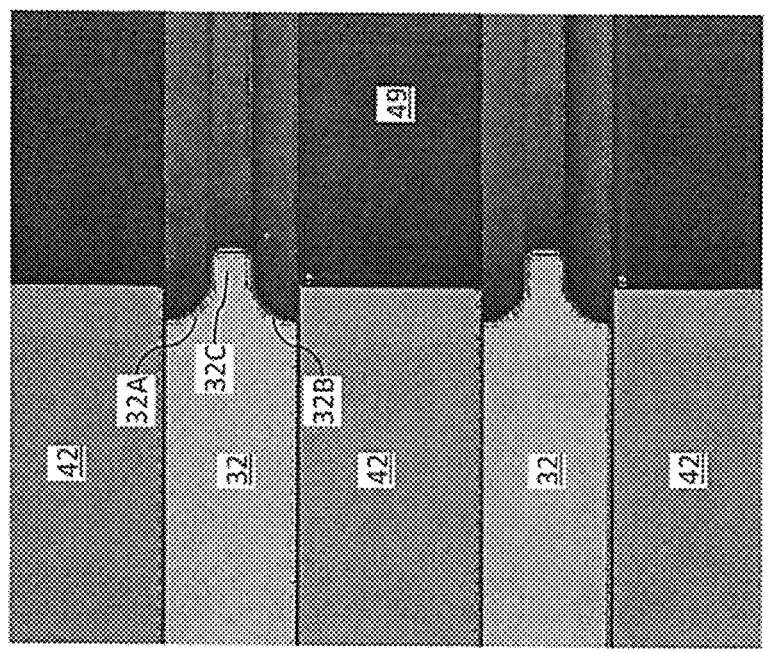
FIG. 3C is a vertical cross-sectional view of the memory opening after an isotropic etch process that forms lateral protrusions on the insulating layers according to the second embodiment of the present disclosure.

Referring to FIGS. 3C and 3D, an isotropic etch process that etches the dielectric material of the insulating layers 32 selective to the sacrificial material layers 42 can be performed. Surface portions of the insulating layers 32 are isotropically etched to form a pair of recessed annular rims on each insulating layer 32. A recessed upper annular rim 32A is formed in an upper region of a sidewall of each insulating layer 32, and a recessed lower annular rim 32B is formed in a lower region of the sidewall of each insulating layer 32. For example, if the sacrificial material layers 42 include silicon nitride and if the insulating layers 32 include silicon oxide, then the isotropic etch process can be a wet etch process employing HF or a vapor phase etch process employing HF vapor. The duration of the isotropic etch process can be controlled such that an annular center portion 32C of each insulating layer 32 protrudes inward (i.e., parallel to the top surface of the substrate) toward a vertical axis of each memory opening 49 compared to the recessed rims 32A and 32B. In this case, the etch distance can be less than one half of the thickness of the insulating layers 32. The recessed regions 44 are formed in the memory opening 49 next to the sacrificial layers 42 between adjacent center portions 32C of layers 32.

Figure 3E:
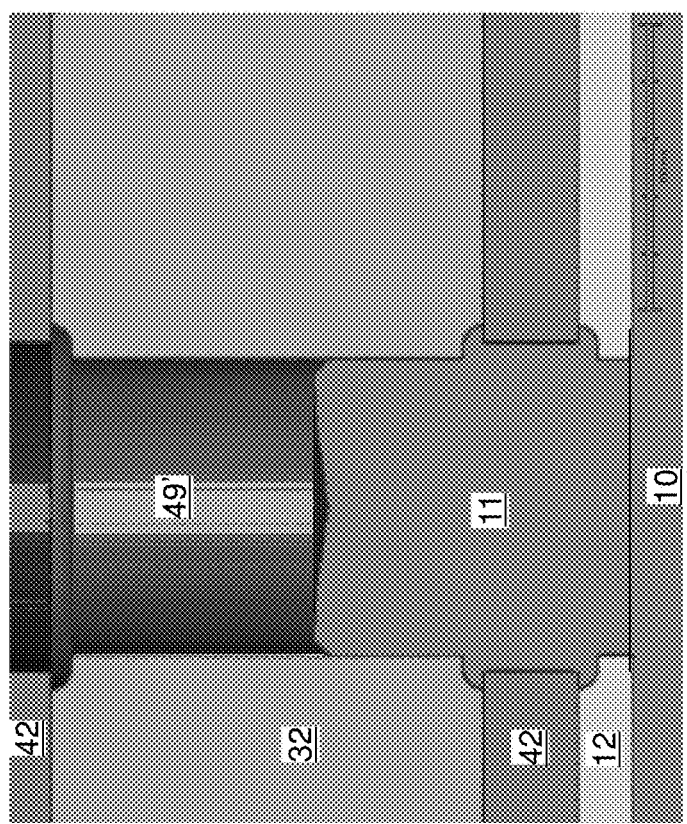
FIG. 3E is a vertical cross-sectional view of the bottom portion of the memory opening after formation of an epitaxial channel portion according to the second embodiment of the present disclosure.

Referring to FIG. 3E, the processing steps of FIG. 2B can be performed to form an epitaxial channel portion 11 from the physically exposed semiconductor surface (such as the surface of the substrate semiconductor layer 10) at the bottom of each memory opening. The epitaxial channel portion 11 can have two protruding annular rim portions 11A, 11B that protrude outward into respective recessed rims 32A, 32B and that are vertically spaced from each other by a recessed annular center portion 11C.

Referring to FIGS. 3F and 3G, a blocking dielectric layer 502L is formed by conformal deposition of at least one dielectric material, which can include silicon oxide. The silicon oxide may be formed by atomic layer deposition (ALD) followed by an optional rapid thermal oxidation (RTO) process. The blocking dielectric layer 502L extends over all sidewall surfaces of the memory openings 49 and over the insulating cap layer 70, and fills the annular rims 32A, 32B of the insulating layers 32 with protruding rim portions 502A, 502B. Each portion of the blocking dielectric layer 502L located at a level of a sacrificial material layer constitutes a blocking dielectric portion that functions as a blocking dielectric material in a three-dimensional memory device. The protruding rim portions 502A, 502B of the blocking dielectric layer 502L can be formed on a peripheral portion of a top surface of each spacer material layer (e.g., each sacrificial material layer 42) and on a peripheral portion of a bottom surface of each spacer material layer, respectively, to leave recessed regions 44A adjacent to the sacrificial layers 42.

Figure 3I:
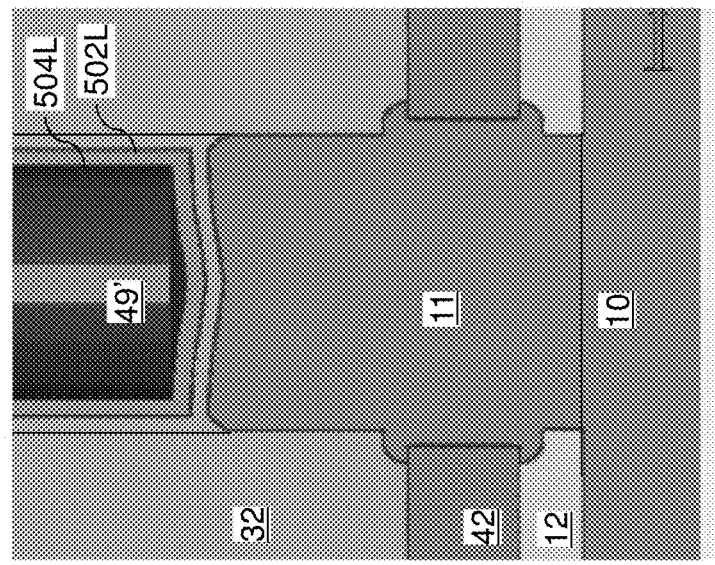
FIG. 3I is a vertical cross-sectional view of the bottom portion of the memory opening of FIG. 3H.
Figure 3H:
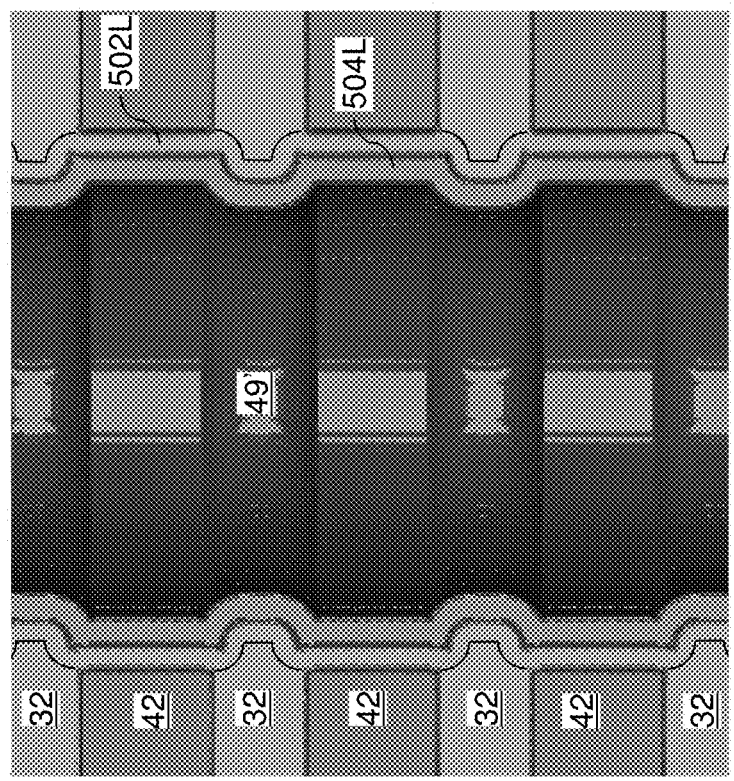
FIG. 3H is a vertical cross-sectional view of the memory opening after formation of a charge trapping material layer according to the second embodiment of the present disclosure.

Referring to FIGS. 3H and 3I, a charge trapping material layer 504L is formed on the blocking dielectric layer 502L. The charge trapping material layer 504L can be formed employing the processing steps of FIG. 2E, and can have the same composition and thickness as the charge trapping material layer 504L of FIG. 2E. Layer 504L extends into the recessed regions 44A.

Referring to FIGS. 3J and 3K, a masking material layer 505L can be deposited on the inner sidewalls of the charge trapping material layer 504L. The masking material layer 505L can be formed employing the processing steps of FIG. 2F, and can have the same composition and thickness as the masking material layer 505L of FIG. 2F.

Figure 3M:
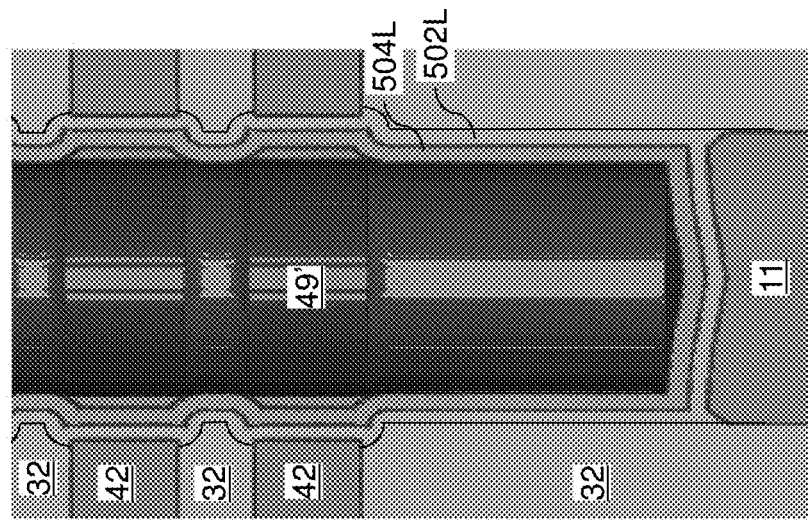
FIG. 3M is a vertical cross-sectional view of the bottom portion of the memory opening of FIG. 3L.
Figure 3L:
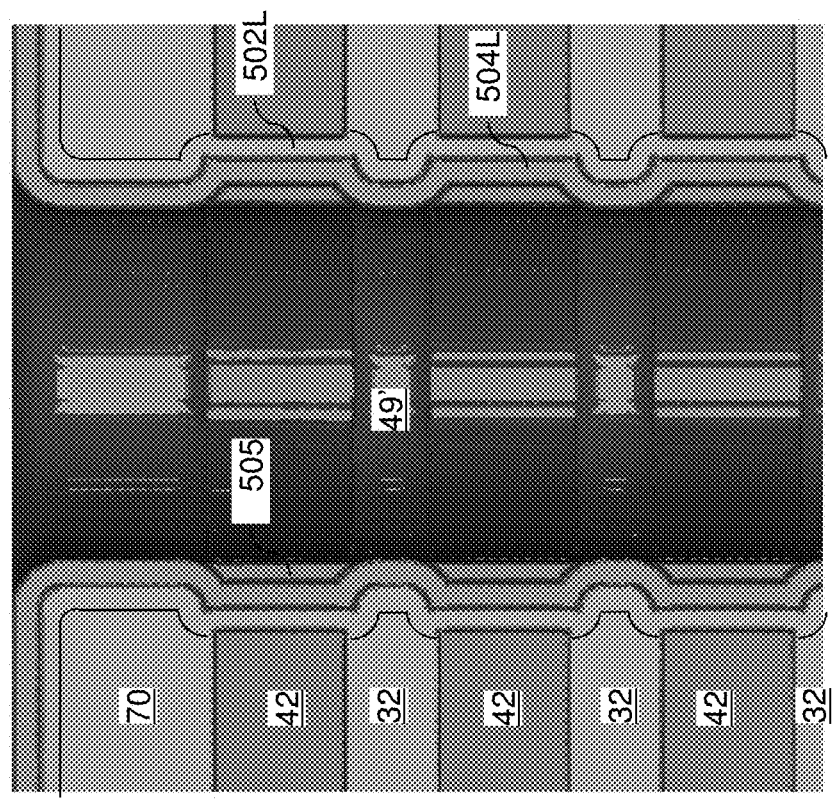
FIG. 3L is a vertical cross-sectional view of the memory opening after patterning the masking material layer into masking material portions according to the second embodiment of the present disclosure.

Referring to FIGS. 3L and 3M, an anisotropic etch can be performed to remove portions of the masking material layer 505L that protrude inward into the memory opening 49 from a horizontally curved vertical plane (which may be a substantially cylindrical vertical plane) that includes innermost surfaces of the charge trapping material layer 504L. The charge trapping material layer 504L can be employed as an etch mask layer for the anisotropic etch. Remaining portions of the masking material layer 505L at levels of the spacer material layers (i.e., the sacrificial material layers 42) in the recessed regions 44A constitute masking material portions 505.

Figure 3N:
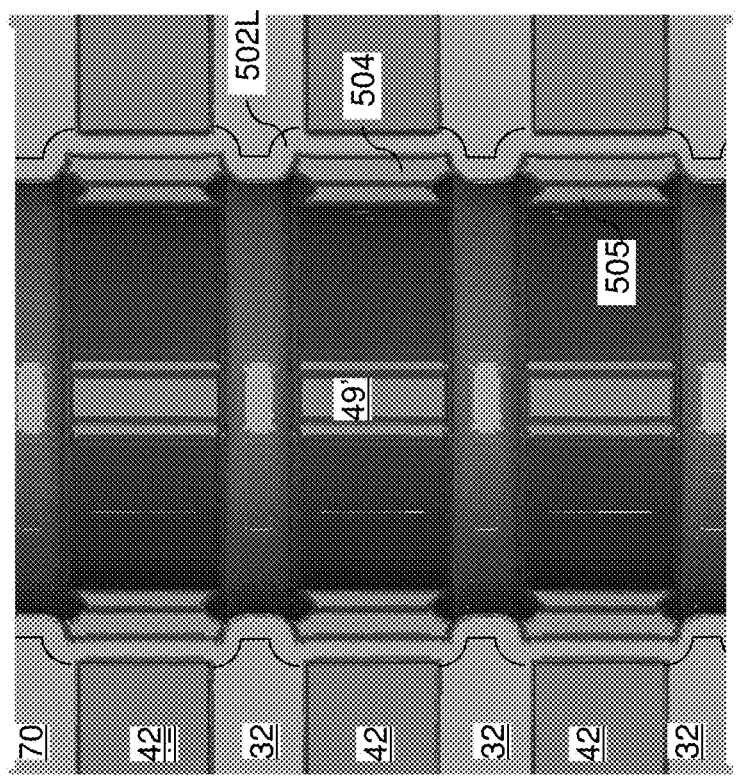
FIG. 3N is a vertical cross-sectional view of the memory opening after patterning the charge trapping material layer into discrete charge trapping material portions according to the second embodiment of the present disclosure.

Referring to FIG. 3N, an etchant that etches the material of the charge trapping material layer 504L selective to the masking material portions 505 is introduced to remove physically exposed portions of the charge trapping material layer 504L. Portions of the charge trapping material layer 504L that are not covered by the masking material portions 505 are removed by the etch process. Remaining portions of the charge trapping material layer 504L constitute charge trapping material portions 504. In one embodiment, the charge trapping material portions 504 include silicon nitride. In an illustrative example, the etchant can be hot phosphoric acid applied in a wet etch process. The charge trapping material portions 504 can be formed entirely within the recessed regions 44A at the levels of the sacrificial material layer 42.

Referring to FIGS. 3O and 3P, an etchant that removes the material of the masking material portions 505 selective to the material of the charge trapping material portions 504 is applied to remove the masking material portions 505. The processing steps of FIG. 2I can be employed to remove the masking material portions 505 selective to the charge trapping material portions 504.

Referring to FIGS. 3Q and 3R, a tunneling dielectric layer 506L can be formed on the inner sidewalls of the charge trapping material portions 504 and vertically spaced portions of the inner sidewall of the blocking dielectric layer 502L. The tunneling dielectric layer 506L can have any composition known in the art, including, but not limited, an ONO stack. The tunneling dielectric layer 506L can be formed by deposition and/or conversion of at least one conformal dielectric material layer. Processes that can be employed to form the tunneling dielectric layer 506L include, but are not limited to, silicon oxide, silicon oxynitride, and dielectric metal oxides. The thickness of the tunneling dielectric layer 506L can be in a range from 1 nm to 4 nm, although lesser and greater thicknesses can also be employed.

A memory film 50L including a vertical stack of annular memory elements is formed in each memory opening 49. Each annular memory element includes, from outside to inside, a blocking dielectric portion which is a portion of the blocking dielectric layer 502L at the level of a sacrificial material layer 42, a charge trapping material portion 504 comprising silicon nitride, and a tunneling dielectric portion which is a portion of the tunneling dielectric layer 506L at the level of the sacrificial material layer 42. Each annular memory element 50 contains one charge trapping (i.e., storage) material portion 504 and is located at the level of a sacrificial material layer 42, and is adjoined to one another through portions of the blocking dielectric layer 502L and portions of the tunneling dielectric layer 506L located at levels of the insulating layers 32. Each of the charge trapping material portions 504 is vertically spaced from one another, and does not contact any other of the charge trapping material portions 504. The shape of each region 504 can be different at the top and bottom ends from the shape at its center (i.e., thicker center portion than end portions).

In one embodiment, each of the charge trapping material portions 504 can have a greater vertical extent than the maximum vertical extent of a sacrificial material layer 42 located at the same level. For example, each of the charge trapping material portions 504 can vertically extend above a first horizontal plane 574 including an interface between the sacrificial material layer 42 located at the same level as the respective charge trapping material portion 504 and an overlying insulating layer 32, and vertically extend below a second horizontal plane 594 including an interface between the sacrificial material layer 42 located at the same level and an underlying insulating layer 32.

Subsequently, the processing steps of FIGS. 2K and 2L can be performed to form a vertical semiconductor channel 60, a dielectric core 62, and a drain region 63 within each memory opening 49. Each combination of a memory film 50L and a vertical semiconductor channel 60 therein constitute a memory stack structure (50L, 60). In this embodiment, the isolation of regions 504 also reduces or prevents data retention degradation due to vertical charge diffusions between adjacent cells in a device with a continuous charge storage (i.e., charge trapping) layer. Furthermore, the sculpting of the insulating layers 32 to include the recessed rims 32A, 32B and protruding center portion 32C improves the gate length and process margin and preserves the channel length to reduce short-channel impact on the device. For example, the gate length may be greater than 23 nm in this embodiment.

Figure 4:
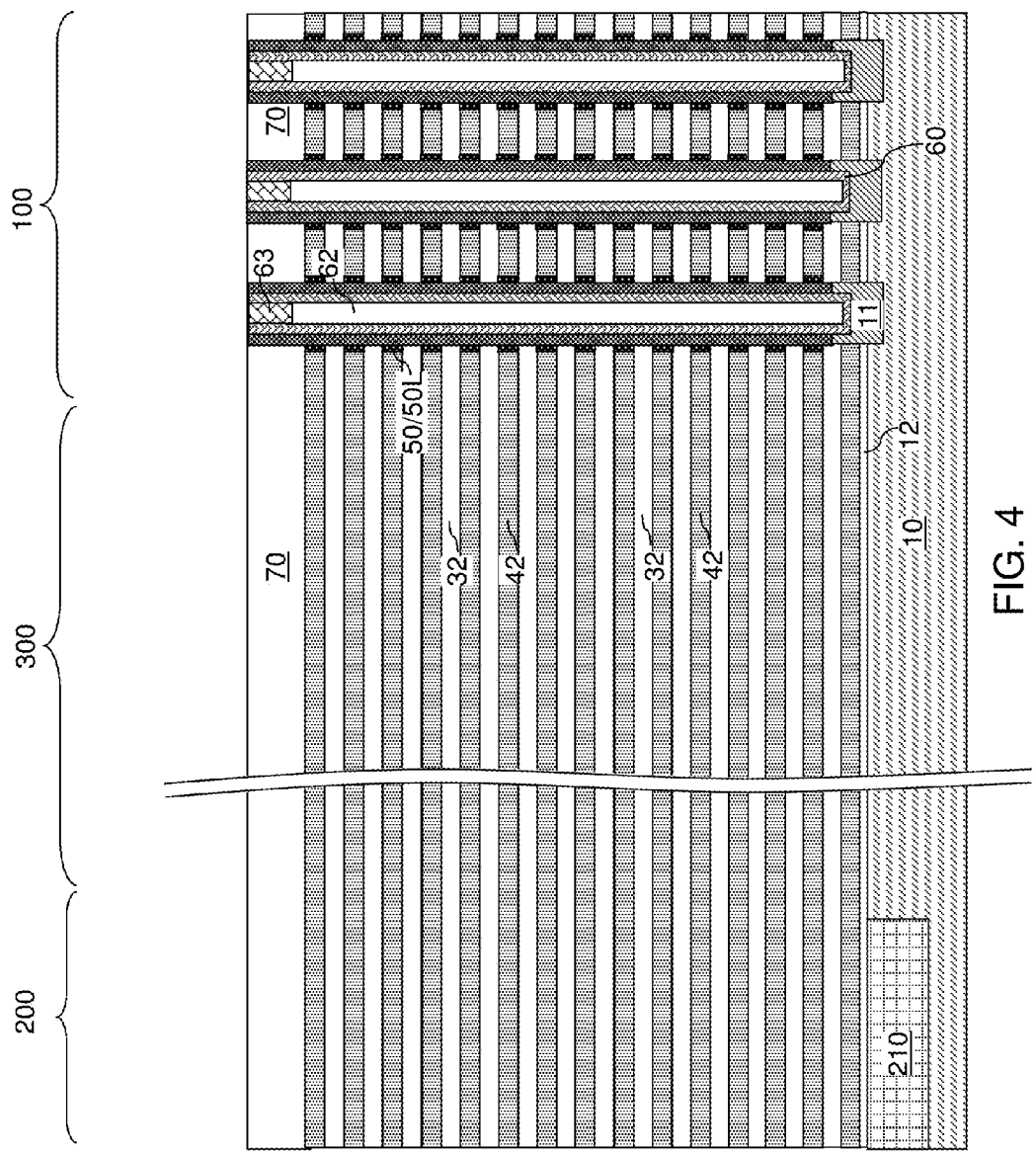
FIG. 4 is a vertical cross-sectional view of the first or second exemplary structure after formation of memory stack structures according to an embodiment of the present disclosure.

Instances of the memory stack structure (50/50L, 60) can be embedded into the exemplary structure illustrated in FIG. 1. FIG. 4 illustrates the exemplary structure that incorporates multiple instances of the memory stack structure of FIG. 2L or the memory stack structure derived from the structure of FIGS. 3Q and 3R by performing the processing steps of FIGS. 2K and 2L. Each exemplary memory stack structure (50/50L, 60) includes a vertical semiconductor channel 60; a tunneling dielectric layer 506 laterally surrounding the vertical semiconductor channel 60; and a vertical stack of charge storage regions laterally surrounding the tunneling dielectric layer 506 (as embodied as a memory material layer 504). The exemplary structure includes a semiconductor device, which comprises a stack (32, 42) including an alternating plurality of material layers (e.g., the sacrificial material layers 42) and insulating layers 32 located over a semiconductor substrate (e.g., over the semiconductor substrate layer 10), and a memory opening extending through the stack (32, 42). While the present disclosure is described employing the illustrated configuration for the memory stack structure, the methods of the present disclosure can be applied to alternative memory stack structures including a polycrystalline semiconductor channel.

Figure 5:
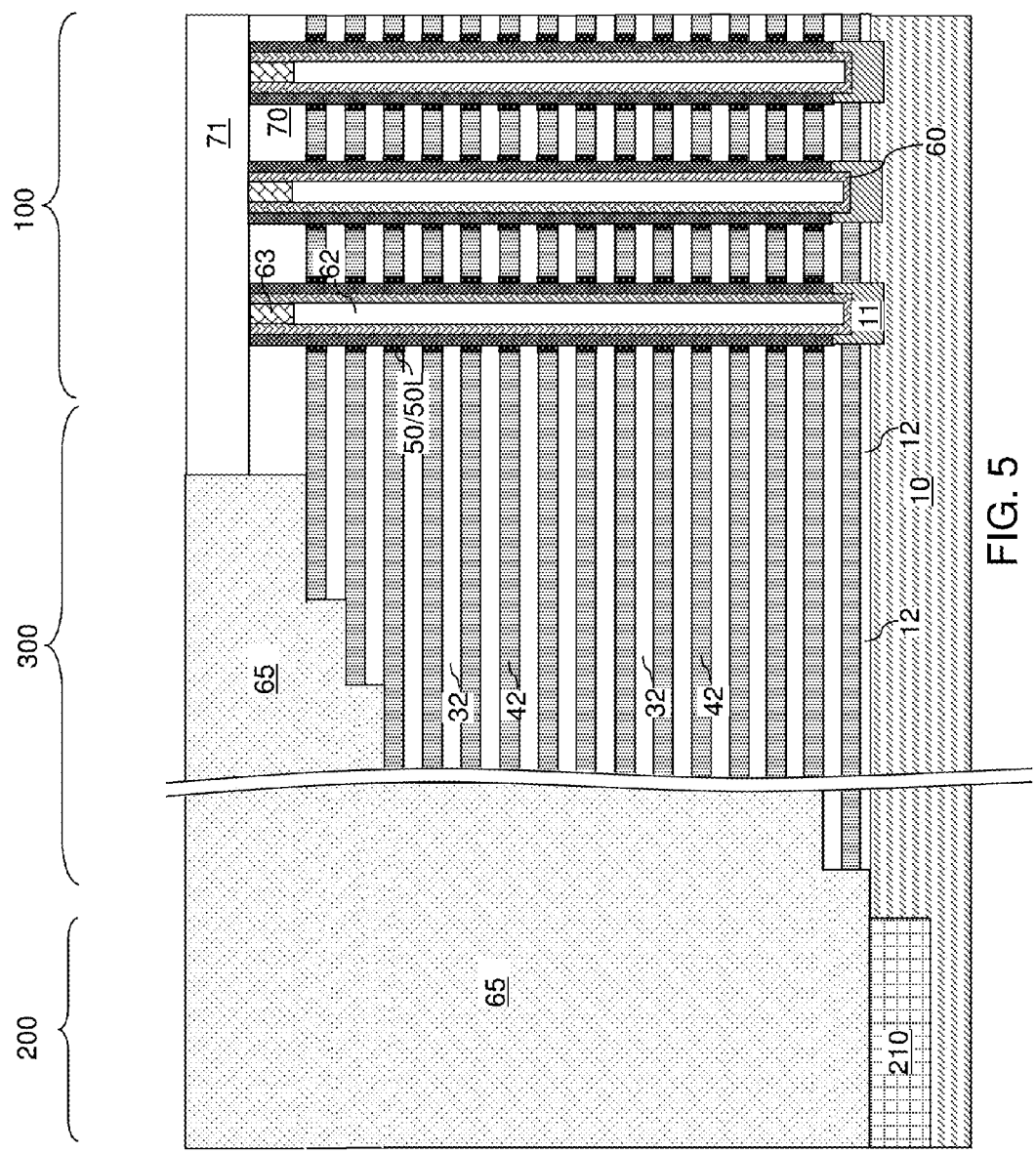
FIG. 5 is a vertical cross-sectional view of the first or second exemplary structure after formation of a set of stepped surfaces and a retro-stepped dielectric material portion according to an embodiment of the present disclosure.

Referring to FIG. 5, an optional first contact level dielectric layer 71 can be formed over the semiconductor substrate layer 10. As an optional structure, the first contact level dielectric layer 71 may, or may not, be formed. In case the first contact level dielectric layer 71 is formed, the first contact level dielectric layer 71 includes a dielectric material such as silicon oxide, silicon nitride, silicon oxynitride, porous or non-porous organosilicate glass (OSG), or a combination thereof. If an organosilicate glass is employed, the organosilicate glass may, or may not, be doped with nitrogen. The first contact level dielectric layer 71 can be formed over a horizontal plane including the top surface of the insulating cap layer 70 and the top surfaces of the drain regions 63. The first contact level dielectric layer 71 can be deposited by chemical vapor deposition, atomic layer deposition (ALD), spin-coating, or a combination thereof. The thickness of the first contact level dielectric layer 71 can be in a range from 10 nm to 300 nm, although lesser and greater thicknesses can also be employed.

In one embodiment, the first contact level dielectric layer 71 can be formed as a dielectric material layer having a uniform thickness throughout. The first contact level dielectric layer 71 may be formed as a single dielectric material layer, or can be formed as a stack of a plurality of dielectric material layers. Alternatively, formation of the first contact level dielectric layer 71 may be merged with formation of at least one line level dielectric layer (not shown). While the present disclosure is described employing an embodiment in which the first contact level dielectric layer 71 is a structure separate from an optional second contact level dielectric layer or at least one line level dielectric layer to be subsequently deposited, embodiments in which the first contact level dielectric layer 71 and at least one line level dielectric layer are formed at a same processing step, and/or as a same material layer, are expressly contemplated herein.

In one embodiment, the first contact level dielectric layer 71, the insulating cap layer 70, and the alternating stack (32, 42) can be removed from the peripheral device region 200, for example, by a masked etch process. In addition, a stepped cavity can be formed within the contact region 300 by patterning a portion of the alternating stack (32, 42). As used herein, a "stepped cavity" refers to a cavity having stepped surfaces. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "step" refers to a vertical shift in the height of a set of adjoined surfaces.

The stepped cavity can have various stepped surfaces such that the horizontal cross-sectional shape of the stepped cavity changes in steps as a function of the vertical distance from the top surface of the semiconductor substrate layer 10. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating stack is defined as the relative position of a pair of a first material layer and a second material layer within the structure. After formation of all stepped surfaces, mask material layers employed to form the stepped surfaces can be removed, for example, by ashing. Multiple photoresist layers and/or multiple etch processes can be employed to form the stepped surfaces.

A dielectric material such as silicon oxide is deposited in the stepped cavity and over the peripheral devices 210 in the peripheral device region 200. Excess portions of the deposited dielectric material can be removed from above the top surface of the first contact level dielectric layer 71, for example, by chemical mechanical planarization (CMP). The remaining portion of the deposited dielectric material filling the stepped cavity in the contact region 300 and overlying the semiconductor substrate layer 10 in the peripheral device region 200 constitutes a retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed as the dielectric material, the silicon oxide of the retro-stepped dielectric material portion 65 may, or may not, be doped with dopants such as B, P, and/or F. The top surface of the retro-stepped dielectric material portion 65 can be coplanar with the top surface of the first contact level dielectric layer 71.

The region over the peripheral devices 210 and the region over the stepped cavities can be filled simultaneously with the same dielectric material, or can be filled in different processing steps with the same dielectric material or with different dielectric materials. The cavity over the peripheral devices 210 can be filled with a dielectric material prior to, simultaneously with, or after, filling of the cavity over the stepped surface of the contact region 300 with a dielectric material. While the present disclosure is described employing an embodiment in which the cavity in the peripheral device region 200 and the stepped cavity in the contact region 300 are filled simultaneously, embodiments are expressly contemplated herein in which the cavity in the peripheral device region 200 and the stepped cavity in the contact region 300 are filled in different processing steps.

Figure 6:
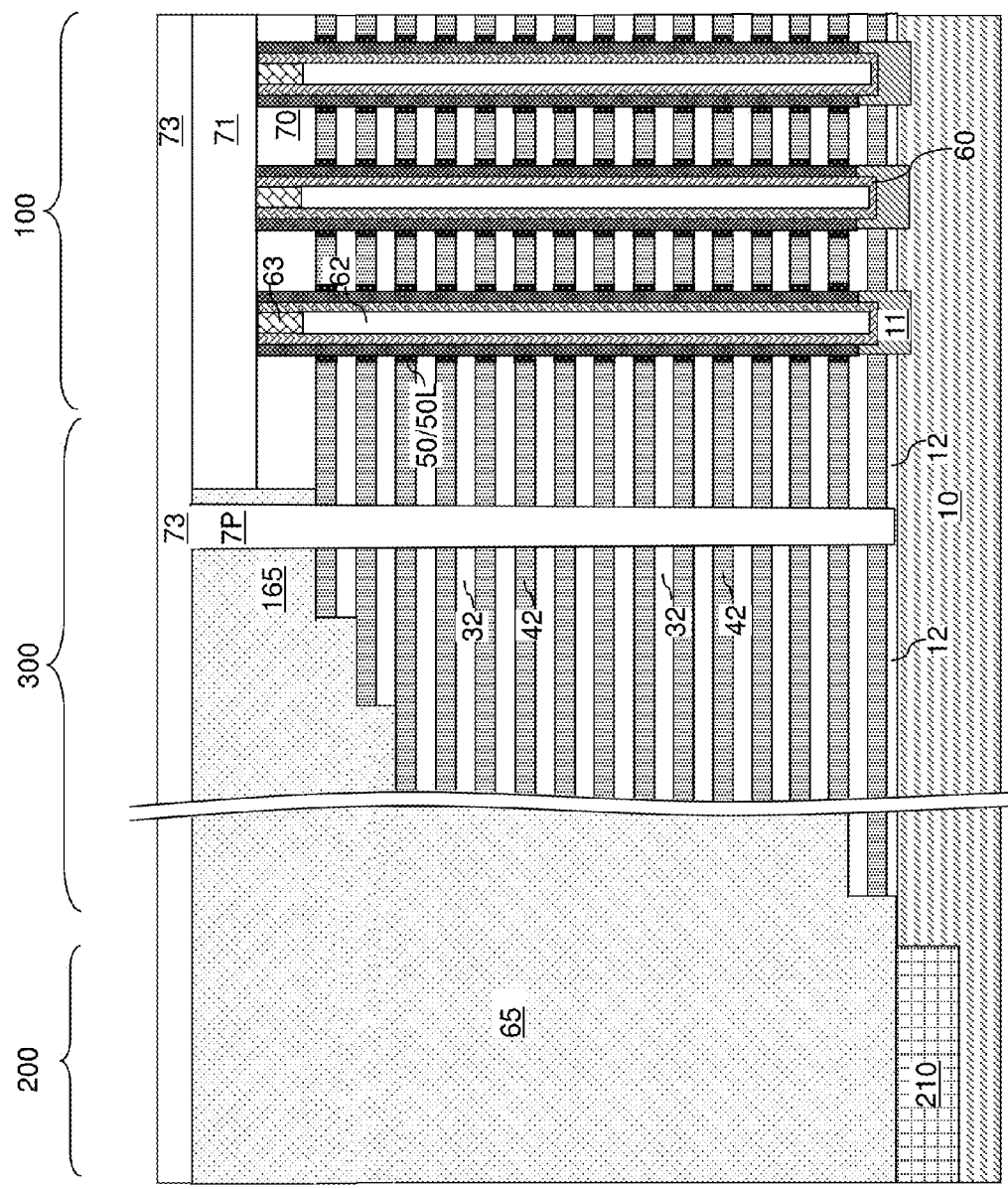
FIG. 6 is a vertical cross-sectional view of the first or second exemplary structure after formation of dielectric pillar structures according to an embodiment of the present disclosure.

Referring to FIG. 6, dielectric support pillars 7P may be optionally formed through the retro-stepped dielectric material portion 65 and/or through the first contact level dielectric layer 71 and/or through the alternating stack (32, 42). In one embodiment, the dielectric support pillars 7P can be formed in the contact region 300, which is located adjacent to the device region 100. The dielectric support pillars 7P can be formed, for example, by forming an opening extending through the retro-stepped dielectric material portion 65 and/or through the alternating stack (32, 42) and at least to the top surface of the semiconductor substrate layer 10, and by filling the opening with a dielectric material that is resistant to the etch chemistry to be employed to remove the sacrificial material layers 42.

In one embodiment, the dielectric support pillars 7P can include silicon oxide and/or a dielectric metal oxide such as aluminum oxide. In one embodiment, the portion of the dielectric material that is deposited over the first contact level dielectric layer 71 concurrently with deposition of the dielectric support pillars 7P can be present over the first contact level dielectric layer 71 as a second contact level dielectric layer 73. Each of the dielectric support pillars 7P and the second contact level dielectric layer 73 is an optional structure. As such, the second contact level dielectric layer 73 may, or may not, be present over the insulating cap layer 70 and the retro-stepped dielectric material portion 65. The first contact level dielectric layer 71 and the second contact level dielectric layer 73 are herein collectively referred to as at least one contact level dielectric layer (71, 73). In one embodiment, the at least one contact level dielectric layer (71, 73) can include both the first and second contact level dielectric layers (71, 73), and optionally include any additional via level dielectric layer that can be subsequently formed. In another embodiment, the at least one contact level dielectric layer (71, 73) can include only the first contact level dielectric layer 71 or the second contact level dielectric layer 73, and optionally include any additional via level dielectric layer that can be subsequently formed. Alternatively, formation of the first and second contact level dielectric layers (71, 73) may be omitted, and at least one via level dielectric layer may be subsequently formed, i.e., after formation of a first source contact via structure.

The second contact level dielectric layer 73 and the dielectric support pillars 7P can be formed as a single continuous structure of integral construction, i.e., without any material interface therebetween. In another embodiment, the portion of the dielectric material that is deposited over the first contact level dielectric layer 71 concurrently with deposition of the dielectric support pillars 7P can be removed, for example, by chemical mechanical planarization or a recess etch. In this case, the second contact level dielectric layer 73 is not present, and the top surface of the first contact level dielectric layer 71 can be physically exposed.

Figure 7B:
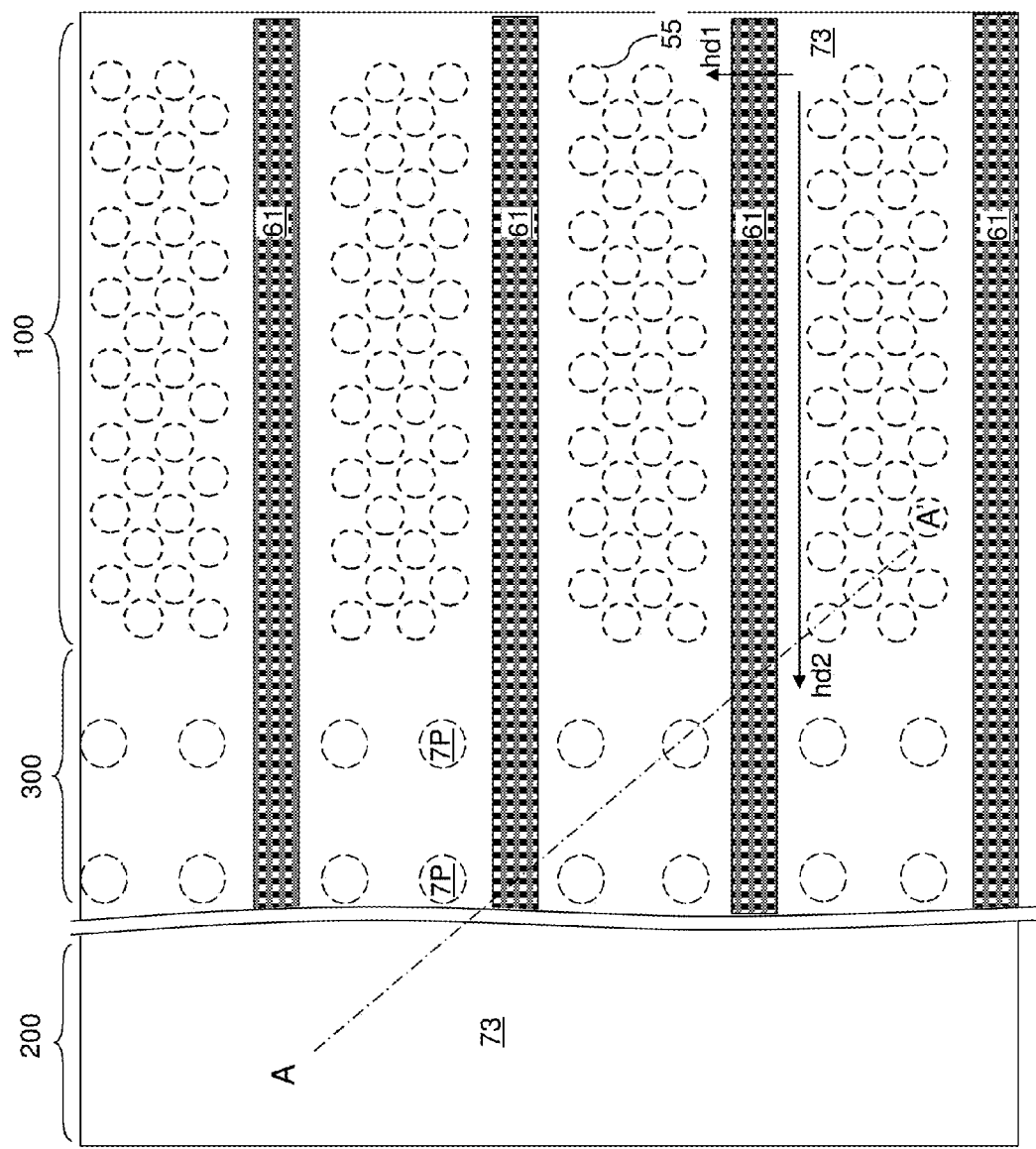
FIG. 7B is a see-through top-down view of the first or second exemplary structure of FIG. 7A. The vertical plane A-A' is the plane of the vertical cross-sectional view of FIG. 7A.

Referring to FIGS. 7A and 7B, a photoresist layer (not shown) can be applied over the at least one contact level dielectric layer (71, 73), and can be lithographically patterned to form openings within areas between the memory blocks. In one embodiment, the memory blocks can be laterally spaced from one another along a first horizontal direction hd1 (e.g., bit line direction), and the dimension of each opening in the photoresist layer along the first horizontal direction hd1 can be less than the spacing between neighboring clusters (i.e., sets) of the memory stack structures (50/50L, 60) along the second horizontal direction hd2 (e.g., word line direction). Further, the dimension of each opening in the photoresist layer along a second horizontal direction hd2 (which is parallel to the lengthwise direction of each cluster of memory stack structures (50/50L, 60)) can be greater than the extent of each cluster of the memory stack structures (50/50L, 60) along the first horizontal direction hd1.

Backside trenches 79 can be formed between each neighboring pair of clusters of the memory stack structures (50/50L, 60) by transferring the pattern of the openings in the photoresist layer through the at least one contact level dielectric layer (71, 73), the retro-stepped dielectric material portion 65, and the alternating stack (32, 42). A top surface of the semiconductor substrate layer 10 can be physically exposed at the bottom of each backside trench 79. In one embodiment, each backside trench 79 can extend along the second horizontal direction hd2 so that clusters of the memory stack structures (50/50L, 60) are laterally spaced along the first horizontal direction hd1. Each cluster of memory stack structures (50/50L, 60) in conjunction with the portions of the alternating stack (32, 42) that surround the cluster constitutes a memory block. Each memory block is laterally spaced from one another by the backside trenches 79.

In one embodiment, source regions 61 can be formed in, or on, portions of the semiconductor substrate layer 10 underlying the backside trenches 79 by implantation of dopants of a second conductivity type (which is the opposite of the first conductivity type) after formation of the backside trenches 79. For example, if the first conductivity type is p-type, the second conductivity type is n-type, and vice versa.

Figure 8:
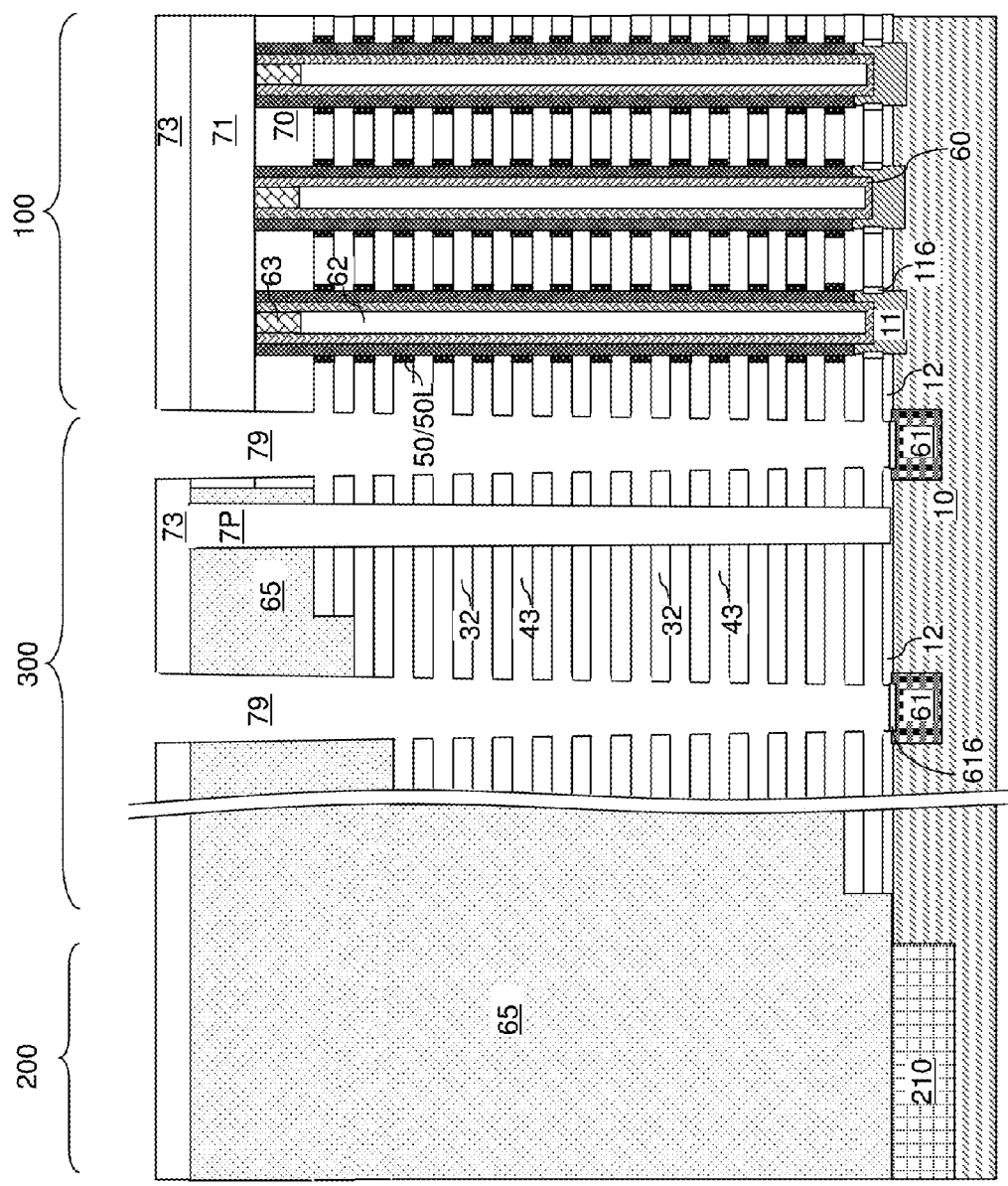
FIG. 8 is a vertical cross-sectional view of the first or second exemplary structure after formation of backside recesses according to an embodiment of the present disclosure.

Referring to FIG. 8, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the dielectric support pillars 7P, the material of the retro-stepped dielectric material portion 65, the semiconductor material of the semiconductor substrate layer 10, and the material of the outermost layer of the first memory films 50. In one embodiment, the sacrificial material layers 42 can include silicon nitride, and the materials of the insulating layers 32, the dielectric support pillars 7P, and the retro-stepped dielectric material portion 65 can be selected from silicon oxide and dielectric metal oxides.

The etch process that removes the second material selective to the first material and the outermost layer of the first memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The dielectric support pillars 7P, the retro-stepped dielectric material portion 65, and the memory stack structures (50/50L, 60) provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The first memory openings in which the memory stack structures (50/50L, 60) are formed are herein referred to as front side recesses or front side cavities in contrast with the backside recesses 43. In one embodiment, the device region 100 comprises an array of monolithic three-dimensional NAND strings having a plurality of device levels disposed above the substrate (e.g., above the semiconductor substrate layer 10). In this case, each backside recess 43 can define a space for receiving a respective word line of the array of monolithic three-dimensional NAND strings.

Each of the plurality of backside recesses 43 can extend substantially parallel to the top surface of the semiconductor substrate layer 10. A backside recess 43 can be vertically bounded by a top surface of an underlying insulating layer 32 and a bottom surface of an overlying insulating layer 32. In one embodiment, each backside recess 43 can have a uniform height throughout.

Subsequently, physically exposed surface portions of epitaxial channel portions 11 and the source regions 61 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a dielectric spacer 116, and to convert a surface portion of each source region 61 into a sacrificial dielectric portion 616. In one embodiment, each dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The dielectric spacers 116 include a dielectric material that includes the same semiconductor element as the epitaxial channel portions 11 and additionally includes at least one non-metallic element such as oxygen and/or nitrogen such that the material of the dielectric spacers 116 is a dielectric material. In one embodiment, the dielectric spacers 116 can include a dielectric oxide, a dielectric nitride, or a dielectric oxynitride of the semiconductor material of the epitaxial channel portions 11. Likewise, each sacrificial dielectric portion 616 includes a dielectric material that includes the same semiconductor element as the source regions 61 and additionally includes at least one non-metallic element such as oxygen and/or nitrogen such that the material of the sacrificial dielectric portions 616 is a dielectric material. In one embodiment, the sacrificial dielectric portions 616 can include a dielectric oxide, a dielectric nitride, or a dielectric oxynitride of the semiconductor material of the source region 61.

Figure 9:
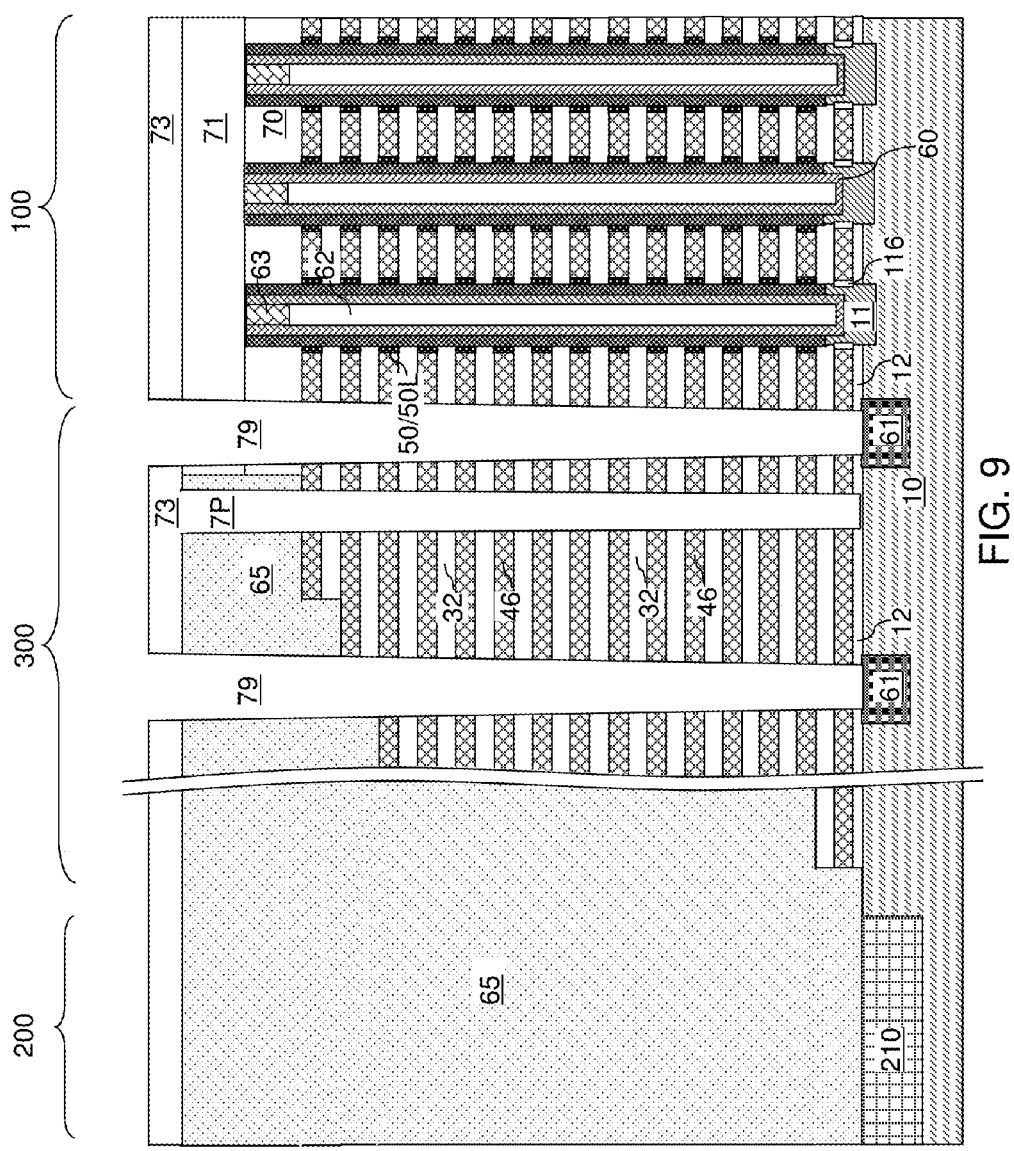
FIG. 9 is a vertical cross-sectional view of the first or second exemplary structure after formation of electrically conductive layers according to an embodiment of the present disclosure.

Referring to FIG. 9, a backside blocking dielectric layer (not shown) can be optionally formed. The backside blocking dielectric layer, if present, comprises a dielectric material that functions as a control gate dielectric for the control gates to be subsequently formed in the backside recesses 43. In case at least one blocking dielectric is present within each memory stack structure (50/50L, 60), the backside blocking dielectric layer is optional. In case a blocking dielectric is not present in the memory stack structures (50/50L, 60), the backside blocking dielectric layer is present.

At least one metallic material can be deposited in the plurality of backside recesses 43, on the sidewalls of the at least one the backside contact trench 79, and over the top surface of the second contact level dielectric layer 73. As used herein, a metallic material refers to an electrically conductive material that includes at least one metallic element The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of backside recesses 43 include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the plurality of backside recesses 43 can be a combination of titanium nitride layer and a tungsten fill material.

In one embodiment, the metallic material can be deposited by chemical vapor deposition or atomic layer deposition. In one embodiment, the metallic material can be employing at least one fluorine-containing precursor gas as a precursor gas during the deposition process. In one embodiment, the molecule of the at least one fluorine-containing precursor gas cam comprise a compound of at least one tungsten atom and at least one fluorine atom. For example, if the metallic material includes tungsten, $WF_6$ and $H_2$ can be employed during the deposition process. Alternatively, fluorine-free deposition chemistry may be employed.

A plurality of electrically conductive layers 46 can be formed in the plurality of backside recesses 43, and a metallic material layer (not shown) can be formed on the sidewalls of each backside contact trench 79 and over the at least one contact level dielectric layer (71,73). Thus, each sacrificial material layer 42 can be replaced with an electrically conductive layer 46. A backside cavity is present in the portion of each backside contact trench 79 that is not filled with the optional backside blocking dielectric layer and the metallic material layer.

The deposited metallic material of the metallic material layer is etched back, for example, by an isotropic etch from the sidewalls of each backside contact trench 79 and from above the second contact level dielectric layer 73. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures (50/50L, 60). In other words, each electrically conductive layer 46 can be a word line that functions as a common control gate electrode for the plurality of vertical memory devices. Optionally, the sacrificial dielectric portions 616 can be removed from above the source regions 61 during the last processing step of the anisotropic etch. Each backside trench 79 extends through the alternating stack (32, 46) of the insulating layers 32 and the electrically conductive layers 46 and to the top surface of the substrate (9, 10).

In case the embodiment of FIGS. 3A-3R is employed to form the memory stack structures (50/50L, 60), each of the charge trapping material portions 504 can have a greater vertical extent than the maximum vertical extent of an electrically conductive layer 46 located at the same level. Further, each of the charge trapping material portions 504 can vertically extend above a first horizontal plane including the bottom surface of an overlying insulating layer 32, and can vertically extend below a second horizontal plane including a top surface of an underlying insulating layer 32.

Figure 10:
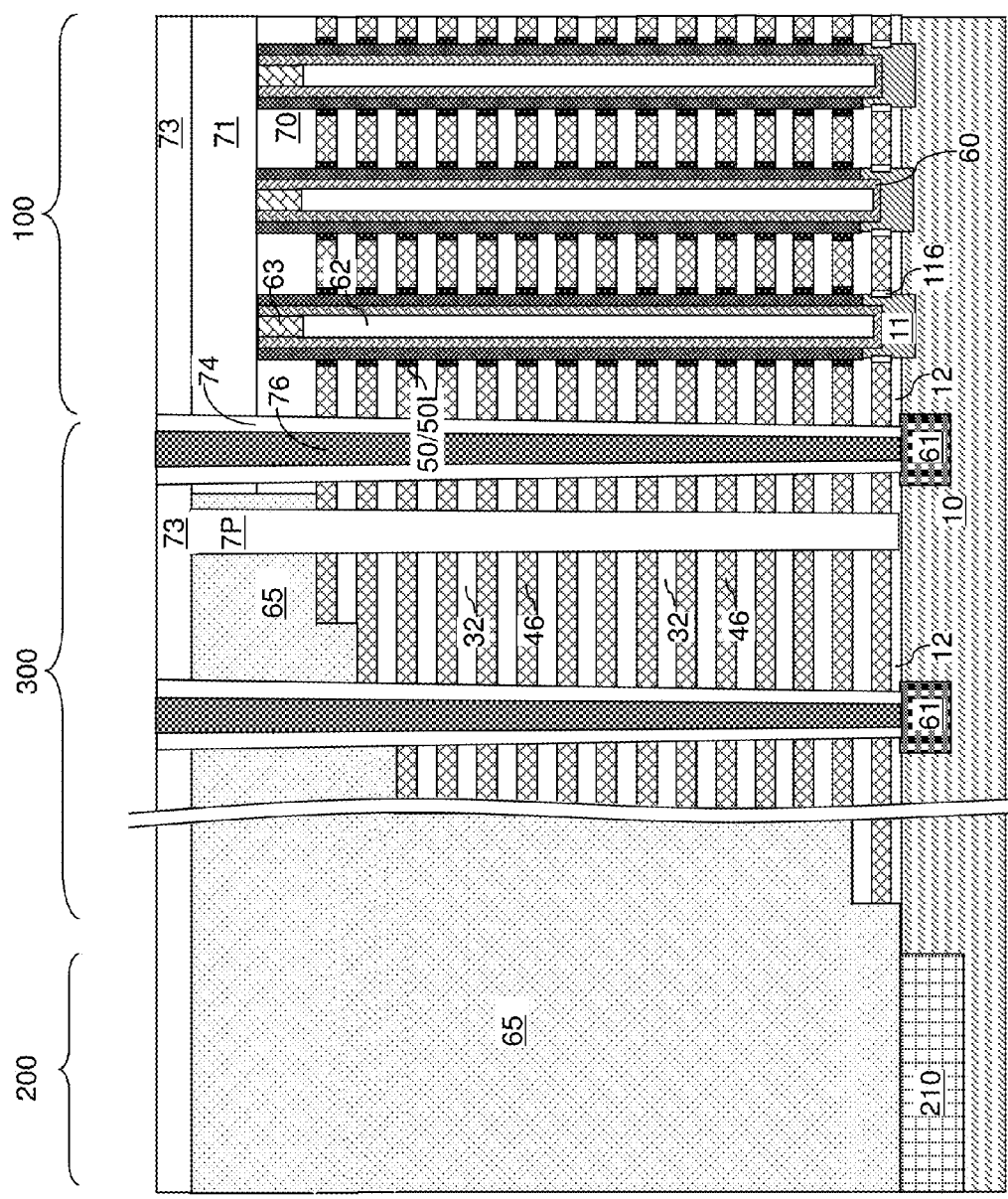
FIG. 10 is a vertical cross-sectional view of the first or second exemplary structure after formation of a backside contact via structure according to an embodiment of the present disclosure.

Referring to FIG. 10, an insulating material layer can be formed in each backside contact trench 79 and over the second contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. The thickness of the insulating material layer can be in a range from 1.5 nm to 60 nm, although lesser and greater thicknesses can also be employed.

Subsequently, an anisotropic etch is performed to remove horizontal portions of the insulating material layer and to optionally remove the horizontal portion of the backside blocking dielectric layer from above the second contact level dielectric layer 73. Each remaining portion of the insulating material layer inside a backside contact trench 79 constitutes a vertically elongated annular structure with a vertical cavity therethrough, which is herein referred to as an insulating spacer 74. In one embodiment, an annular bottom surface of the insulating spacer 74 contacts a top surface of the source region 61.

Each insulating spacer 74 can be formed over the sidewalls of the backside contact trench 79, and can be formed directly on substantially vertical sidewalls of the backside blocking dielectric layer, if present, or on memory film (50, 50L), and directly on the sidewalls of the electrically conductive layers 46, i.e., directly on the sidewalls of the metallic material portions 46. The thickness of each insulating spacer 74, as measured at a bottom portion thereof, can be in a range from 1.5 nm to 60 nm, although lesser and greater thicknesses can also be employed. In one embodiment, the thickness of the insulating spacer 74 can be in a range from 3 nm to 10 nm. Each insulating spacer 74 laterally surrounds a cavity, which is herein referred to as a backside cavity. A top surface of a source region 61 (which is a doped semiconductor material portion) can be physically exposed at the bottom of each backside cavity that is provided within an insulating spacer 74.

At least one metallic material can be deposited into each backside cavity. The at least one metallic material can include, for example, a metallic diffusion barrier layer including a conductive metallic nitride and/or a conductive metallic carbide. Further, the at least one metallic material can include a metallic fill material such as an elemental metal (e.g., W, Co, or Al) or an intermetallic alloy of at least two elemental metals. Excess portions of the at least one metallic material can be removed from above the horizontal plane including the top surface of the contact level dielectric layers (71, 73). Each remaining portion of the at least one metallic material in a backside trench constitutes a backside contact via structure 76.

Figure 11A:
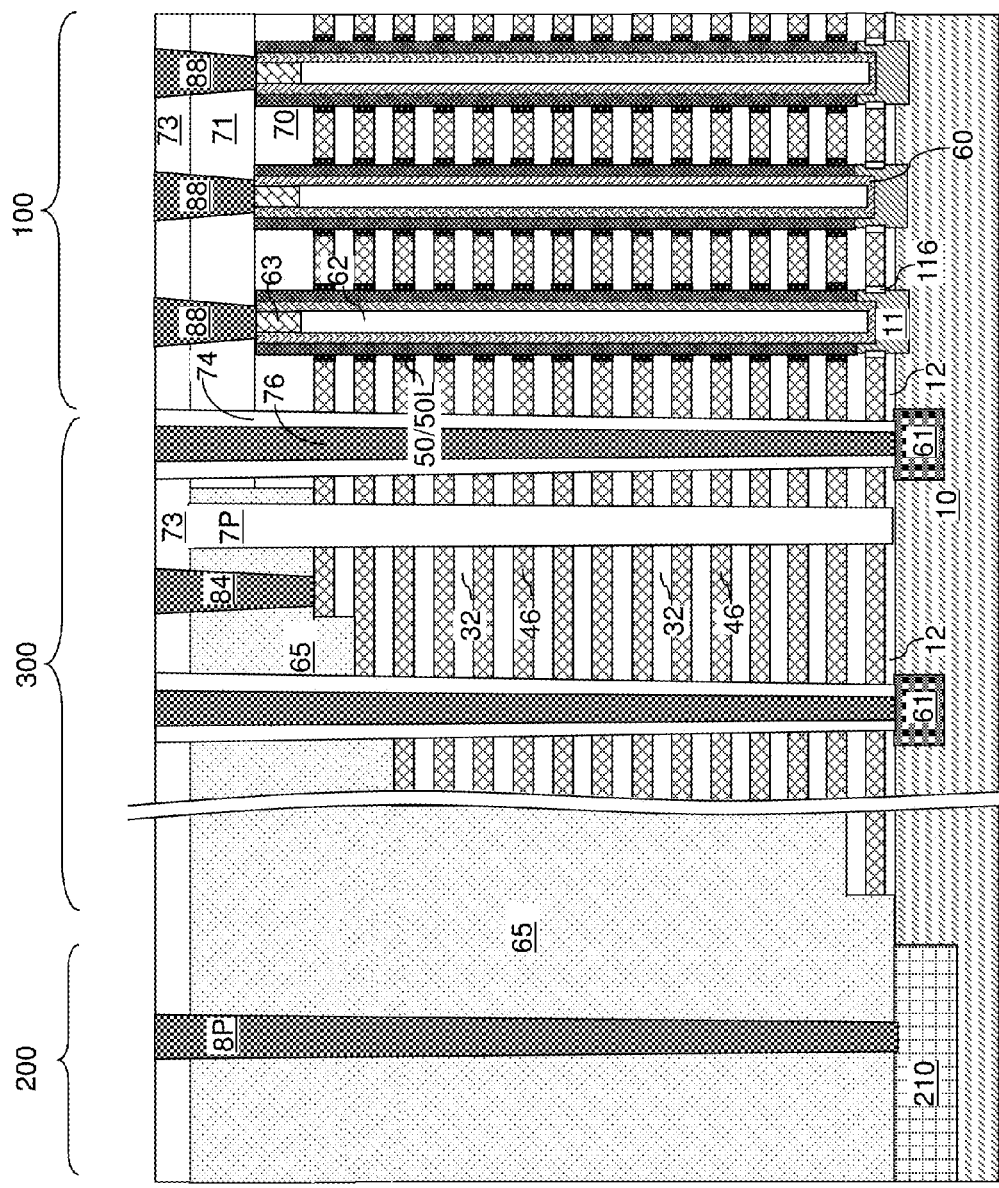
FIG. 11A is a vertical cross-sectional view of the first or second exemplary structure after formation of various contact via structures according to an embodiment of the present disclosure.
Figure 11B:
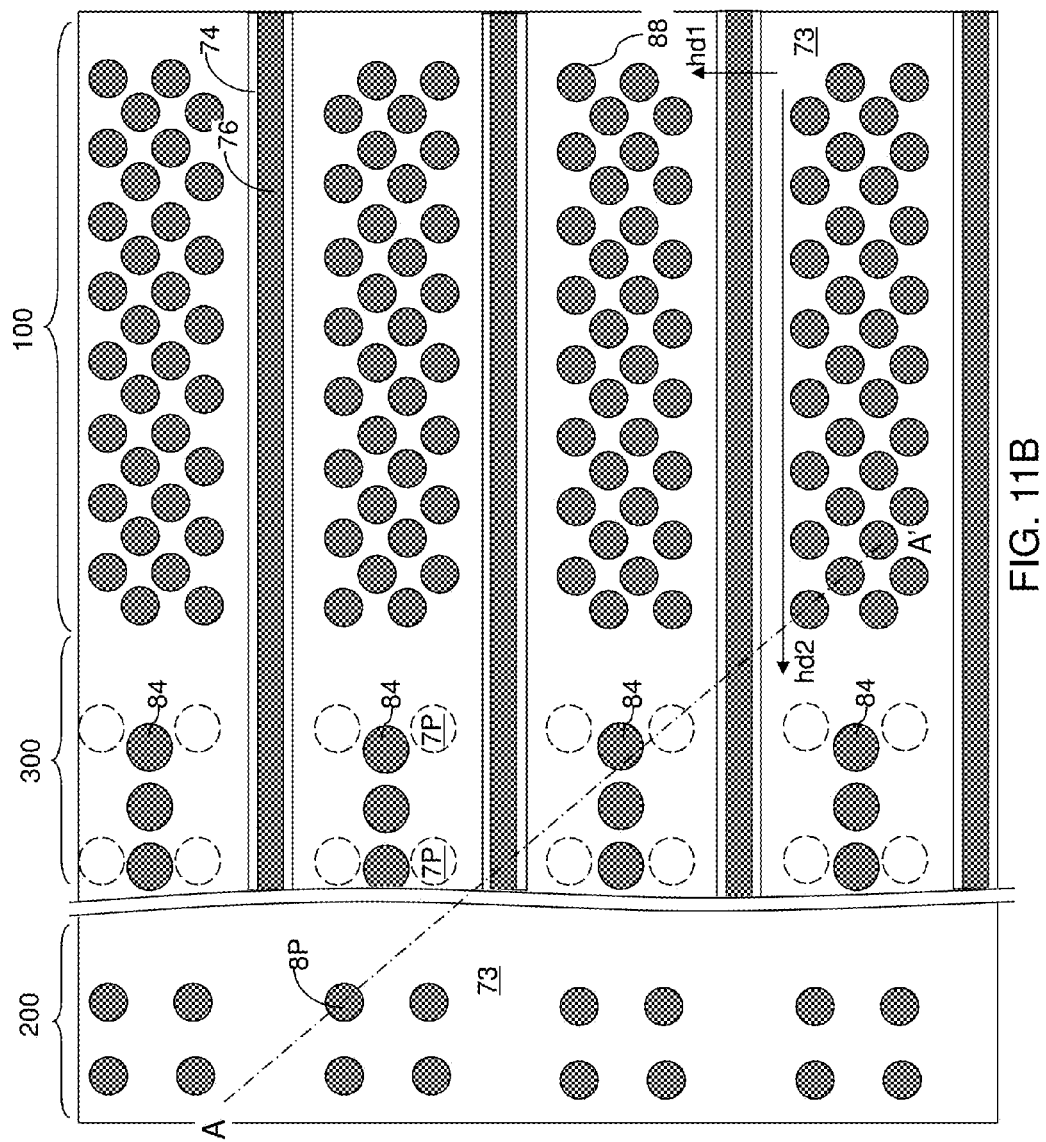
FIG. 11B is a see-through top-down view of the first or second exemplary structure of FIG. 11A. The vertical plane A-A' is the plane of the vertical cross-sectional view of FIG. 11A.

Referring to FIGS. 11A and 11B, a photoresist layer (not shown) can be applied over the topmost layer of the exemplary structure (which can be, for example, the second contact level dielectric layer 73), and is lithographically patterned to form various openings in the device region 100, the peripheral device region 200, and the contact region 300. The locations and the shapes of the various openings are selected to correspond to electrical nodes of the various devices to be electrically contacted by contact via structures. In one embodiment, a single photoresist layer may be employed to pattern all openings that correspond to the contact via cavities to be formed, and all contact via cavities can be simultaneously formed by at least one anisotropic etch process that employs the patterned photoresist layer as an etch mask. In another embodiment, a plurality of photoresist layers may be employed in combination with a plurality of anisotropic etch processes to form different sets of contact via cavities with different patterns of openings in the photoresist layers. The photoresist layer(s) can be removed after a respective anisotropic etch process that transfers the pattern of the openings in the respective photoresist layer through the underlying dielectric material layers and to a top surface of a respective electrically conductive structure.

In an illustrative example, drain contact via cavities can be formed over each memory stack structure (50/50L, 60) in the device region 100 such that a top surface of a drain region 63 is physically exposed at the bottom of each drain contact via cavity. Word line contact via cavities can be formed to the stepped surfaces of the alternating stack (32, 46) such that a top surface of an electrically conductive layer 46 is physically exposed at the bottom of each word line contact via cavity in the contact region 300. A device contact via cavity can be formed to each electrical node of the peripheral devices 210 to be contacted by a contact via structure in the peripheral device region.

The various via cavities can be filled with at least one conductive material, which can be a combination of an electrically conductive metallic liner material (such as TiN, TaN, or WN) and a metallic fill material (such as W, Cu, or Al). Excess portions of the at least one conductive material can be removed from above the at least one contact level dielectric layer (71, 73) by a planarization process, which can include, for example, chemical mechanical planarization (CMP) and/or a recess etch. Drain contact via structures 88 can be formed on the respective drain regions 63. Word line contact via structures 84 can be formed on the respective electrically conductive layers 46. Peripheral device contact via structures 8P can be formed on the respective nodes of the peripheral devices 210. Additional metal interconnect structures (not shown) and interlayer dielectric material layers (not) shown can be formed over the exemplary structure to provide electrical wiring among the various contact via structures.

According to a third embodiment of the present disclosure, the processing steps of FIGS. 12A-12E can be employed to form a third exemplary memory stack structure in each of the memory opening of FIG. 1 instead of employing the processing steps of FIGS. 2B-2L or the processing steps of FIGS. 3B-3R. FIGS. 12A-12E illustrate sequential vertical cross-sectional views of a memory opening during formation of the third exemplary memory stack structure.

Figure 12B:
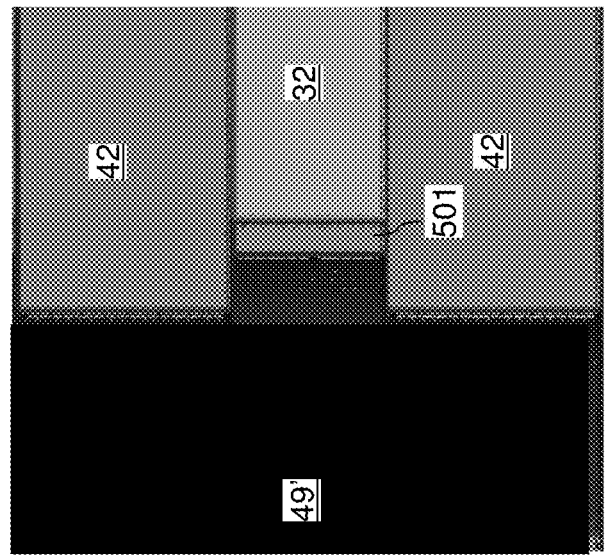
FIG. 12B is a vertical cross-sectional view of the memory opening after formation of an etch-stop material portion according to the third embodiment of the present disclosure.
Figure 12A:
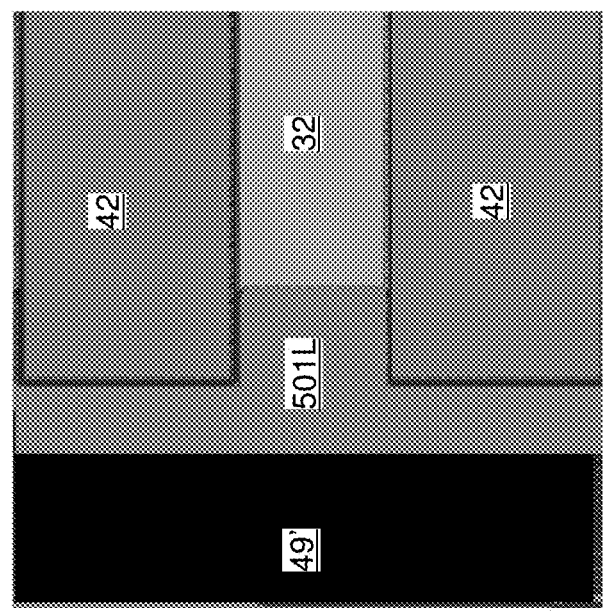
FIG. 12A is a vertical cross-sectional view of a memory opening after formation of an etch-stop material layer according to a third embodiment of the present disclosure.

Referring to FIG. 12A, recessed regions 144 are formed in each memory opening 49 by laterally recessing sidewalls of the insulating layers 32 outward with respect to sidewalls of the spacer material layers, i.e., the sacrificial material layers 42. Recessing of the sidewalls of the insulator layers 32 selective to the sacrificial material layers 42 can be performed, for example, employing an isotropic etch that removes the first material of the insulating layers 32 selective to the second material of the sacrificial material layers 42. The lateral recess distance for the insulating layers 32 (as measured from the sidewalls of the sacrificial material layers 42) can be in a range from 3 nm to 15 nm, although lesser and greater lateral recess distances can also be employed.

An etch-stop material layer 501L is deposited in the recess regions in the memory openings 49. The etch-stop material layer 501L includes a material that can be employed as an etch stop during a subsequent etch process that removes the insulating layers 32. For example, if the insulating layers 32 include silicon oxide, the etch-stop material layer 501L can include amorphous silicon or polysilicon, which is resistant to hydrofluoric acid that can be employed to etch silicon oxide. A memory cavity 49' is present within the etch-stop material layer 501L, i.e., within a portion of the memory opening 49 that is not filled with the etch-stop material layer 501L.

Referring to FIG. 12B, the etch-stop material layer 501L can be etched by an etch process, which can be an isotropic etch process or an anisotropic etch process. The duration of the etch process is selected such that a portion of the etch-stop material layer 501L remains within each recessed region 144 at the levels of the insulating layers 32. Each remaining etch-stop material portion (i.e., each remaining portion of the etch-stop material layer 501L) can be an annular spacer, which is herein referred to as an etch-stop annular spacer 501. Each etch-stop annular spacer 501 can be formed on a recessed sidewall of the insulating layers 32. In one embodiment, the etch-stop annular spacers 501 can include polysilicon. The remaining portion 144A of each recessed region 144 remains exposed.

Figure 12D:
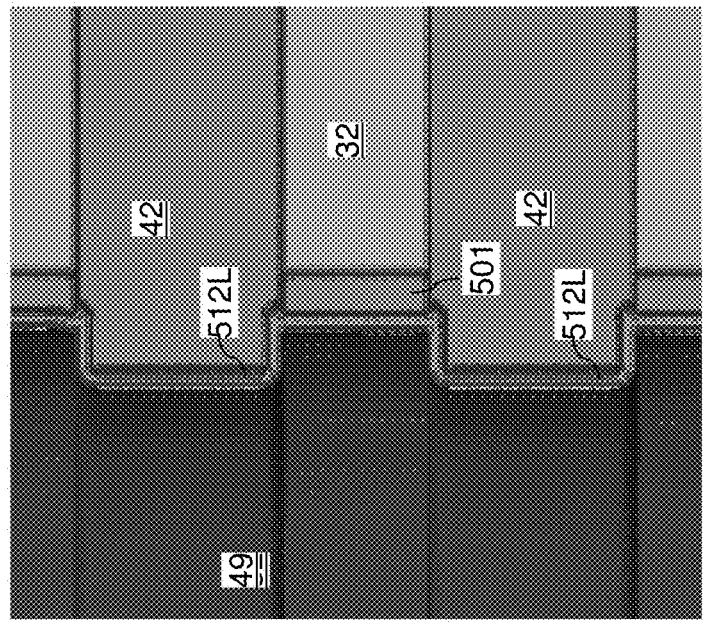
FIG. 12D is a vertical cross-sectional view of the memory opening after formation of an outer blocking dielectric layer according to the third embodiment of the present disclosure.
Figure 12C:
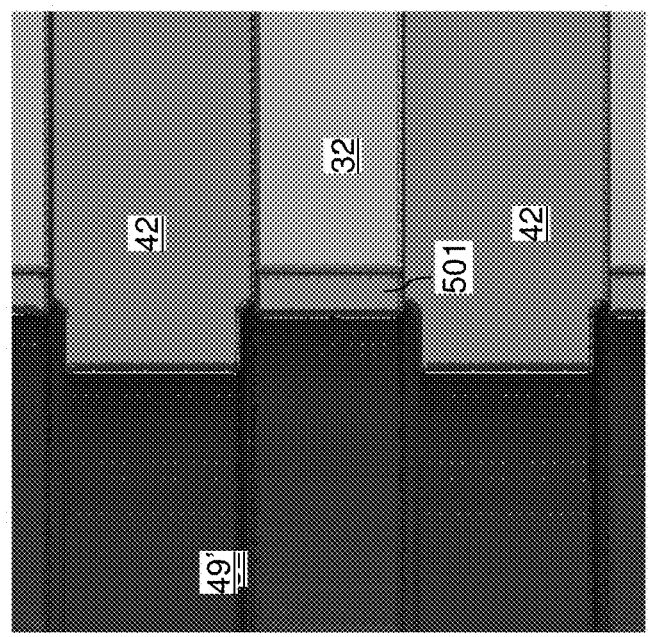
FIG. 12C is a vertical cross-sectional view of the memory opening after an isotropic etch that recesses physically exposed surfaces of the sacrificial material layers according to the third embodiment of the present disclosure.

Referring to FIG. 12C, a surface recess process can be optionally performed on the sacrificial material layers 42 to isotropically recess the physically exposed portions of the sacrificial material layers 42. For example, if the sacrificial material layers 42 include silicon nitride, a dilute phosphoric acid etch process can be performed to recess the physically exposed surfaces by a uniform distance, which may be in a range from 0.5 nm to 5 nm, although lesser and greater thicknesses can also be employed. An undercut (e.g., recessed rims 42A, 42B) may be formed at each portion of the sacrificial material layers 42 that adjoin an etch-stop annular spacer 501 and the recessed region 144A.

Referring to FIG. 12D, an outer blocking dielectric layer 512L can be optionally formed, for example, by deposition of a conformal silicon nitride layer and by conversion of the conformal silicon nitride layer into a silicon oxynitride layer or a silicon oxide layer. The thickness of the outer blocking dielectric layer 512L can be in a range from 0.5 nm to 5 nm, although lesser and greater thicknesses can also be employed.

Figure 12E:
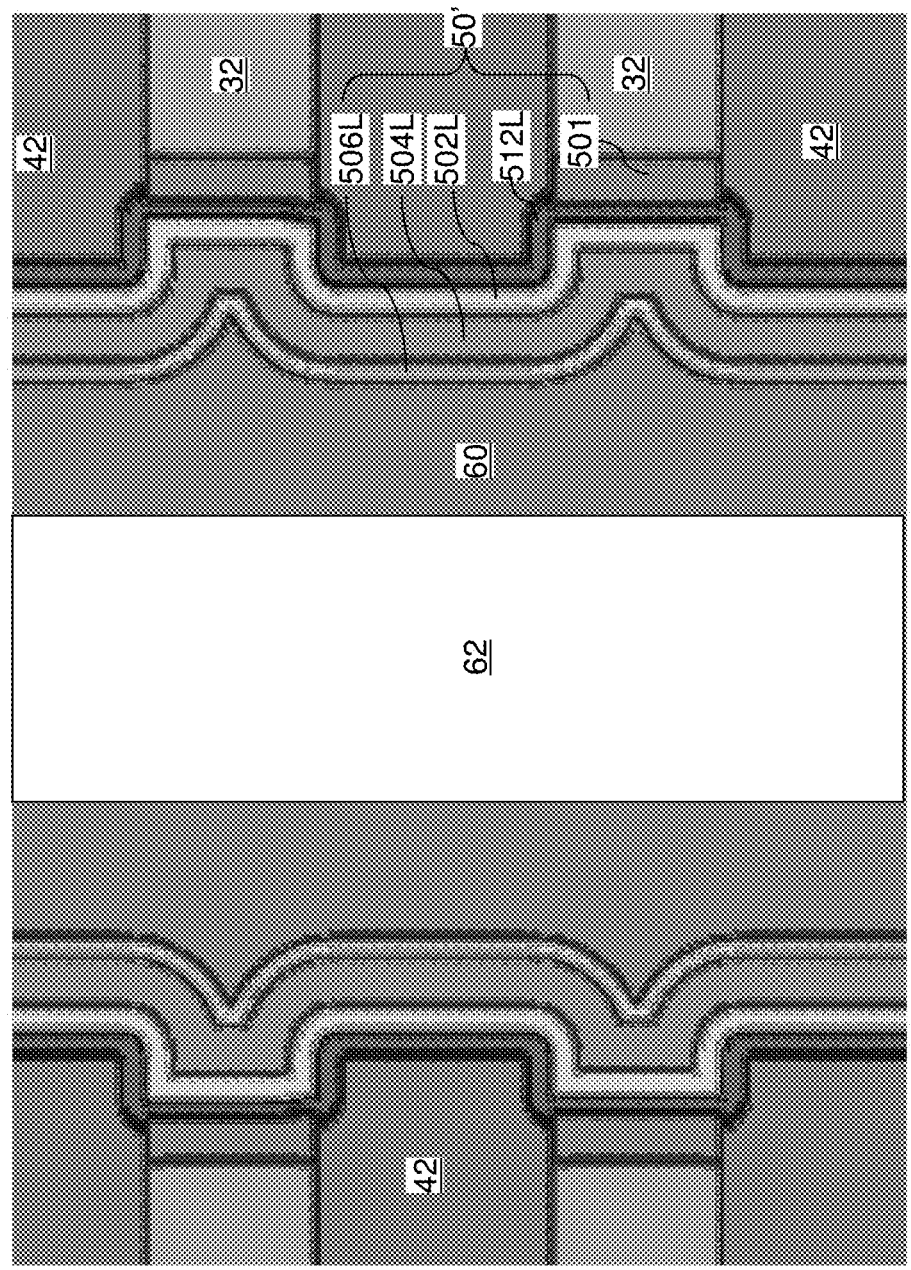
FIG. 12E is a vertical cross-sectional view of the memory opening after formation of a blocking dielectric layer, a charge trapping material layer, a tunneling dielectric layer, a vertical semiconductor channel, and a dielectric core according to the third embodiment of the present disclosure.

Referring to FIG. 12E, the processing steps of FIGS. 3F, 3H, and 3Q are sequentially performed to form a stack of a blocking dielectric layer 502L, a charge trapping material layer 504L, and a tunneling dielectric layer 506L over layer 512L and over sidewalls of the insulating layers 32 and spacer material layers (i.e., the sacrificial material layers 42). Unlike the second embodiment, the charge trapping material layer 504L is not patterned prior to formation of the tunneling dielectric layer 506L. Instead, patterning of the charge trapping material layer 504L is performed at a later processing step after replacement of the sacrificial material layers 42 with electrically conductive layers 46.

Subsequently, the processing steps of FIGS. 2K and 2L can be performed to form a vertical semiconductor channel 60, an optional dielectric core 62, and a drain region 63 in each memory opening 49.

The processing steps of FIGS. 5, 6, 7A and 7B, 8, and 9 can be performed to replace the spacer material layers (i.e., the sacrificial material layers 42) with electrically conductive layers 46.

Figure 13A:
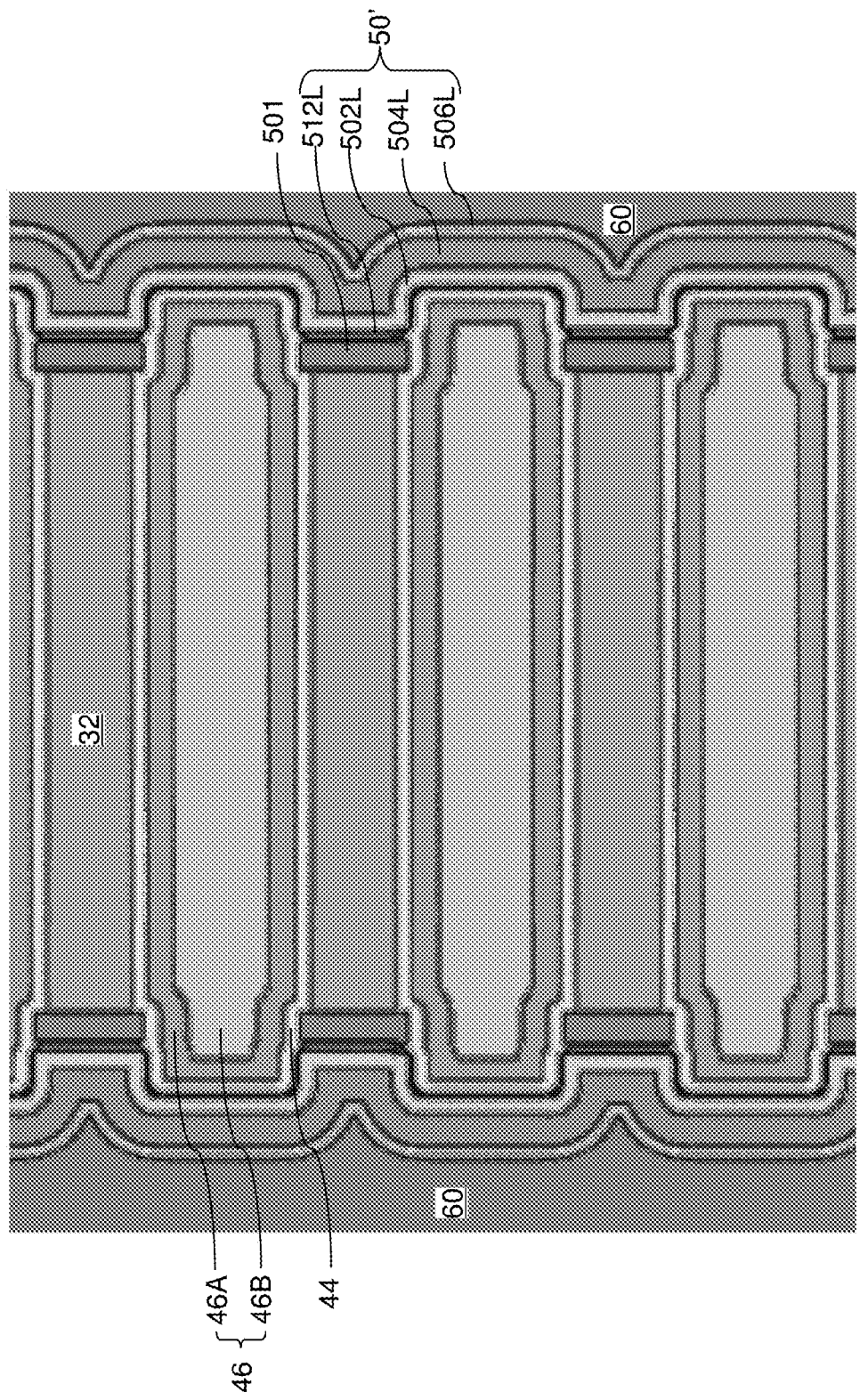
FIG. 13A is a vertical cross-sectional view of the alternating stack after formation of electrically conductive layers at a processing step corresponding to FIG. 9 according to the third embodiment of the present disclosure.

Referring to FIG. 13A, a region between two memory stack structures (50', 60) is illustrated. Each memory stack structure (50', 60) includes a memory film 50' and a vertical semiconductor channel 60. Each memory film 50' includes an outer blocking dielectric layer 512L, a blocking dielectric layer 502L including blocking dielectric portions (i.e., portions of the blocking dielectric layer 502L located at levels of the electrically conductive layers 46), a charge trapping material layer 504L, and a tunneling dielectric layer 506L. An etch-stop annular spacer 501 is present at each level of the insulating layers 32 around each memory stack structure (50', 60). An optional backside blocking dielectric layer 44, such as an aluminum oxide layer, can be formed after the processing steps of FIG. 8 and prior to the processing steps of FIG. 9. Each electrically conductive layer 46 can include a metallic liner 46A including a diffusion barrier material (such as TiN, TaN, and/or WN) and a metallic fill material portion 46B including a metal (such as W, Co, Cu, and/or Ru).

Figure 13B:
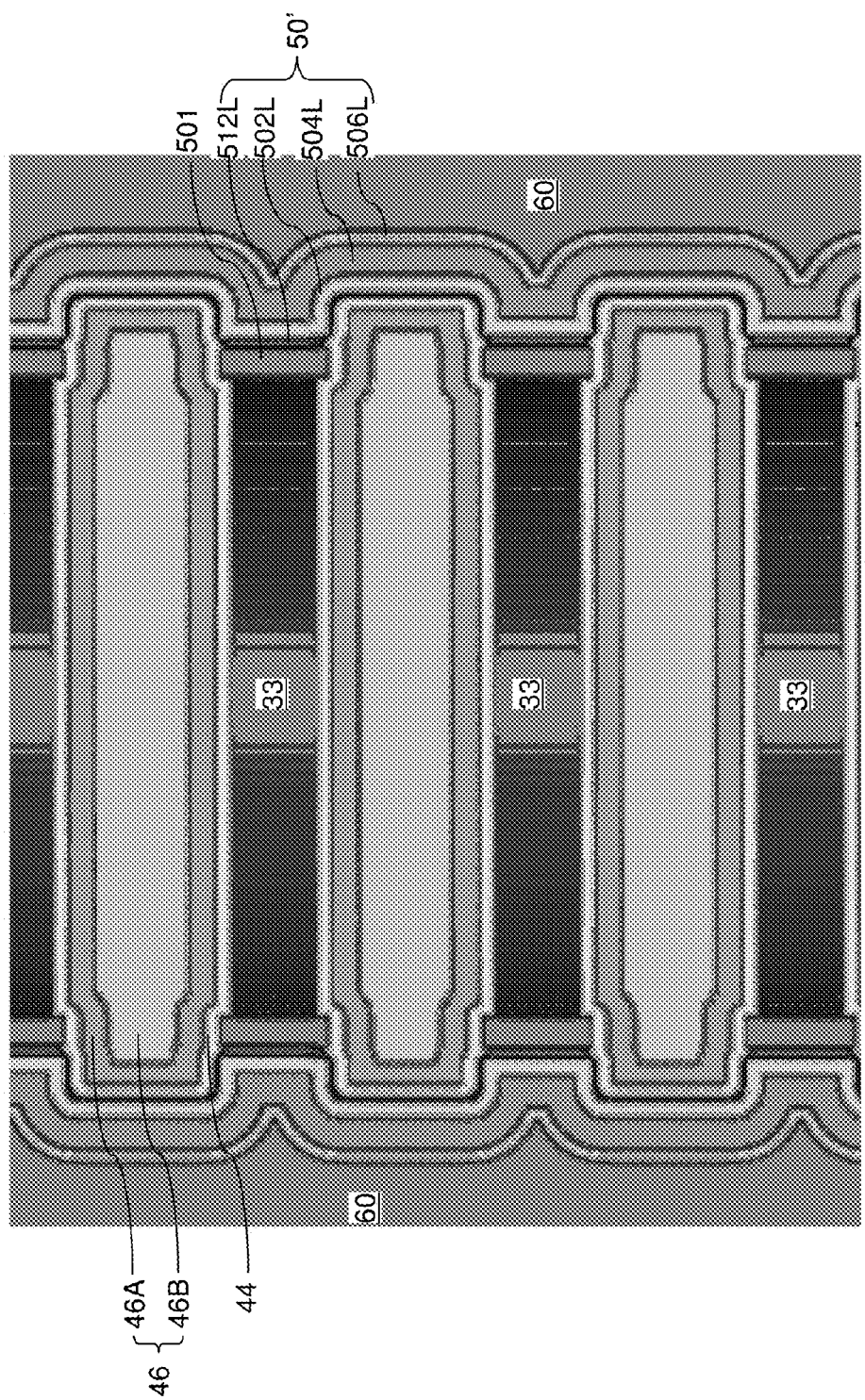
FIG. 13B is a vertical cross-sectional view of the alternating stack after formation of backside cavities by removing the insulating layers according to an embodiment of the present disclosure.

Referring to FIG. 13B, an etchant that removes the first material of the insulating layers 32 can be introduced into the backside trenches 79 and remove the insulating layers 32 selective to the electrically conductive layers 46 and selective to the etch-stop annular spacers 501. In case the optional backside blocking dielectric layer 44 is present, the etch chemistry of the etchant many be selective to the dielectric material of the backside blocking dielectric layer 44. For example, if the insulating layers 32 include silicon oxide, the etchant can include hydrofluoric acid. Backside cavities 33 are formed in the volumes from which the insulating layers 32 are removed. The extent of the backside cavities 33 are defined by the outer surfaces of the electrically conductive layers 46 and the etch-stop annular spacers 501.

Figure 13C:
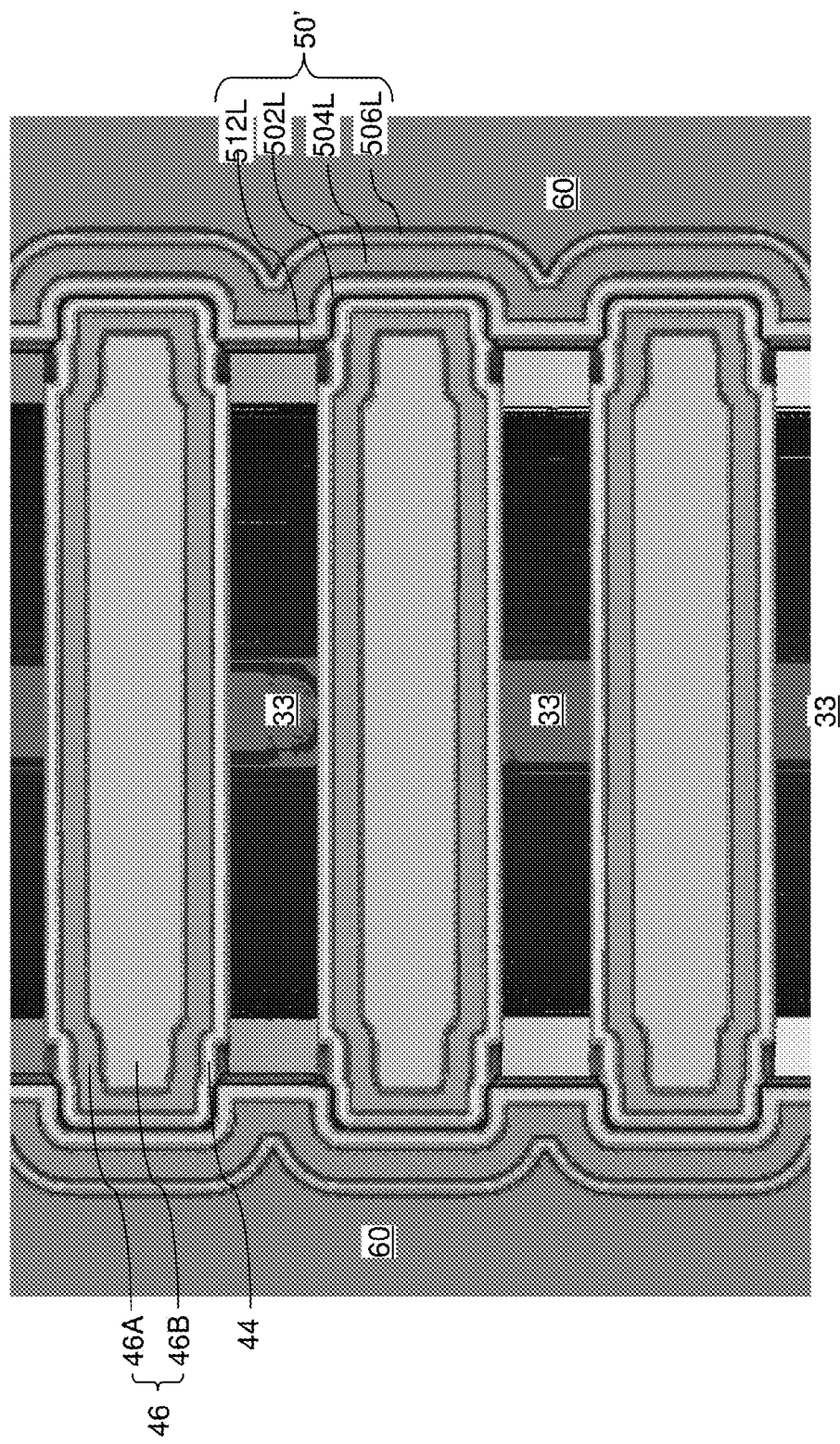
FIG. 13C is a vertical cross-sectional view of the alternating stack after removal of the etch-stop material portions according to an embodiment of the present disclosure.

Referring to FIG. 13C, the etch-stop annular spacers 501 are removed selective to the outer blocking dielectric layer 512L, if present, or selective to the blocking dielectric layer 502L if an outer blocking dielectric layer is not present. For example, if the etch-stop annular spacers 501 include polysilicon, the etch-stop annular spacers 501 can be removed by a wet etch process employing a KOH solution.

Figure 13D:
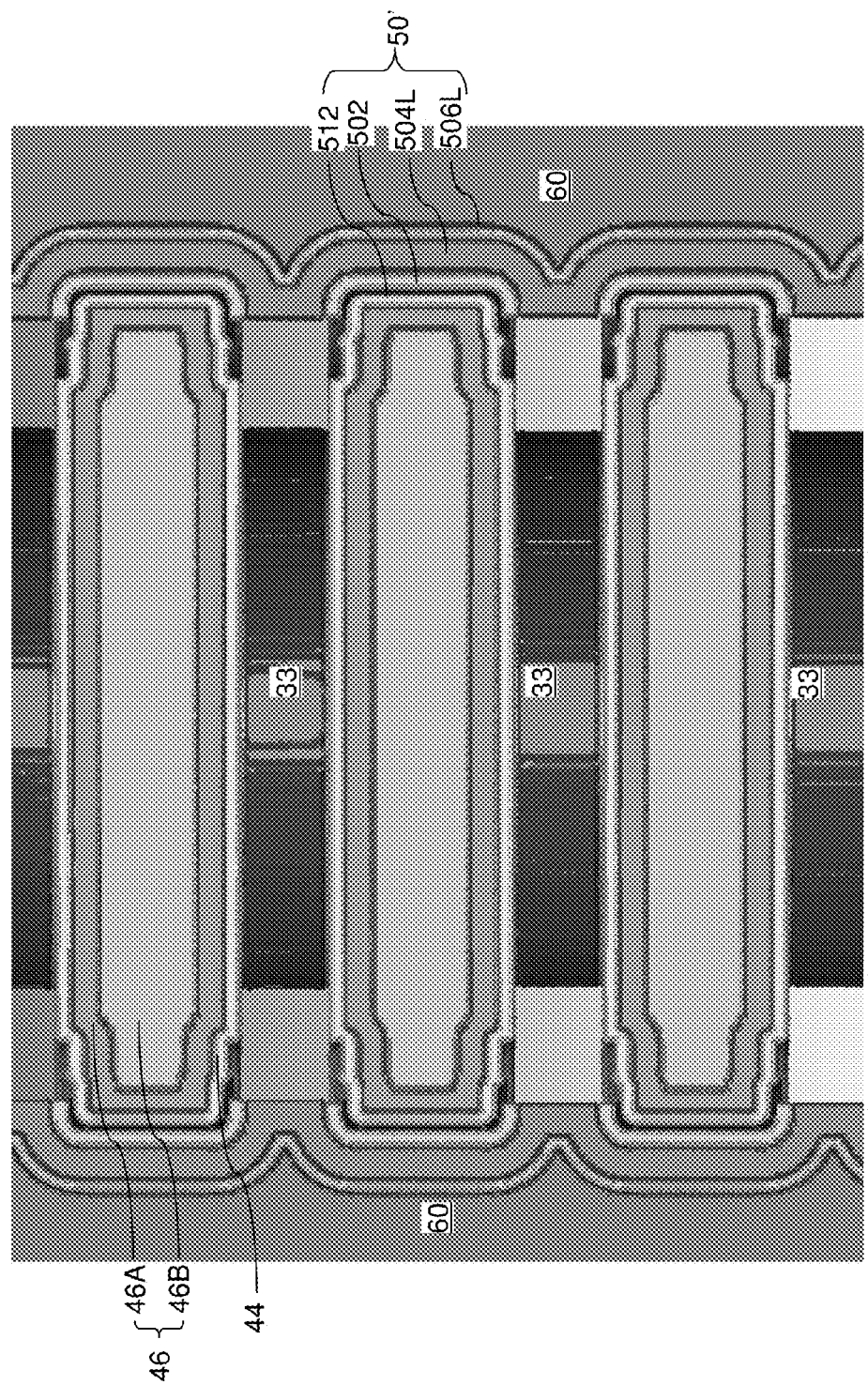
FIG. 13D is a vertical cross-sectional view of the alternating stack after removal of physically exposed portions of the blocking dielectric layer according to an embodiment of the present disclosure.

Referring to FIG. 13D, portions of the outer blocking dielectric layer 512L that are physically exposed to the backside cavities 33 (i.e., portions located at the levels of the backside cavities 33) can be etched by an isotropic etch process, which can be, for example, a wet etch that employs hydrofluoric acid. The outer blocking dielectric layer 512L becomes singulated (i.e., separated) at each level of the backside cavities 33. Each remaining portion of the outer blocking dielectric layer 512L constitutes an outer blocking dielectric portion 512.

Subsequently, portions of the blocking dielectric layer 502L that are physically exposed to the backside cavities 33 (i.e., portions located at the levels of the backside cavities 33) can be etched by an isotropic etch process, which can be, for example, a wet etch that employs a suitable etchant that removes the material of the blocking dielectric layer 502L selective to the material of the charge trapping material layer 504L. The blocking dielectric layer 502L becomes singulated (i.e., separated) at each level of the backside cavities 33. Each remaining portion of the blocking dielectric layer 502L constitutes a blocking dielectric portion 502.

Figure 13E:
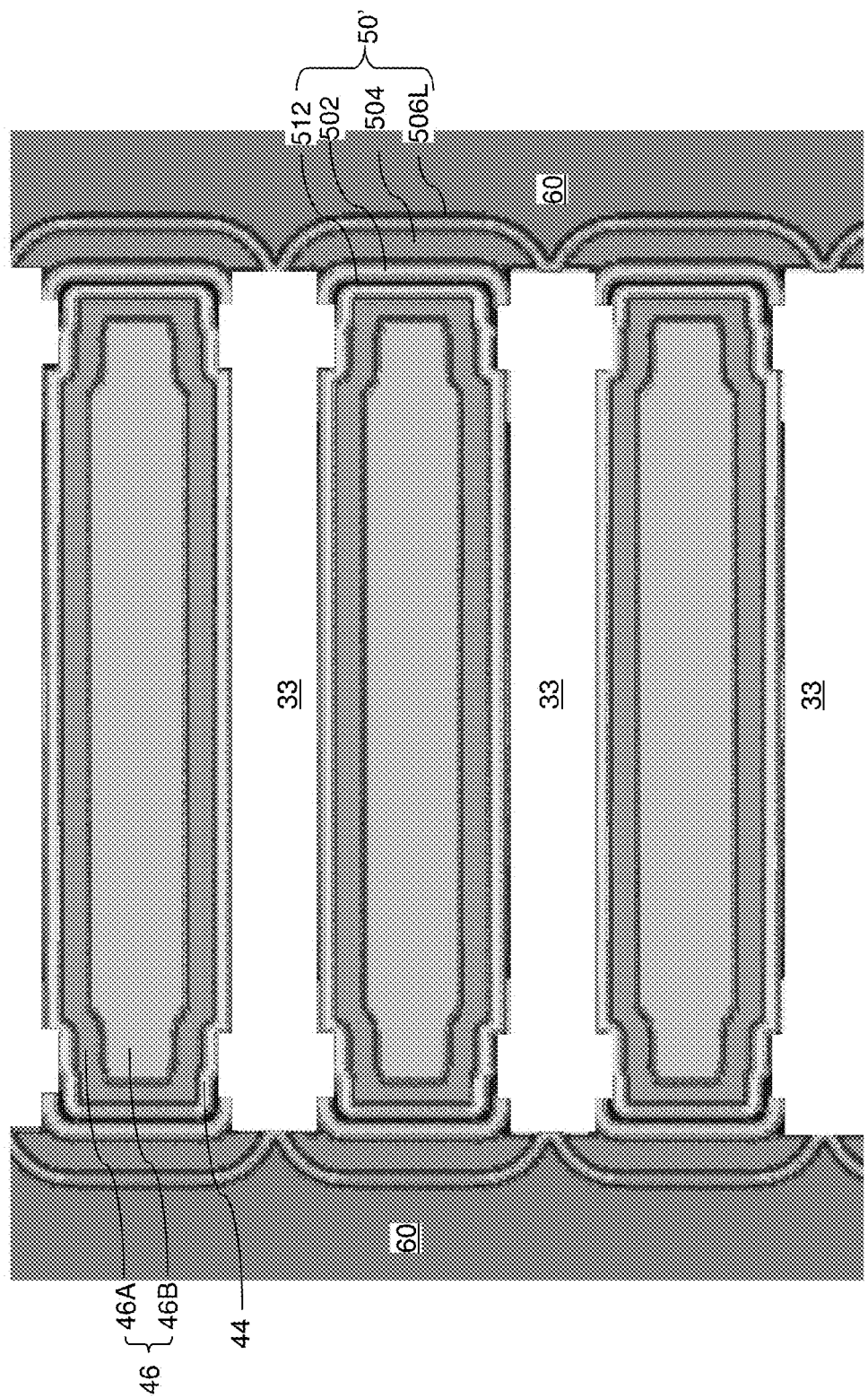
FIG. 13E is a vertical cross-sectional view of the alternating stack after singulating the charge trapping material layer into discrete charge trapping material portions according to an embodiment of the present disclosure.

Referring to FIG. 13E, portions of the charge trapping material layer 504L are removed at each level of the backside cavities 33 by introducing an etchant into the backside trenches 79 and then through the backside cavities 33. Specifically, portions of the charge trapping material layer 504L that are physically exposed to the backside cavities 33 (i.e., portions located at the levels of the backside cavities 33) can be etched by an isotropic etch process, which can be, for example, a wet etch that employs phosphoric acid in case the charge trapping material layer 504L includes silicon nitride. The charge trapping material layer 504L becomes singulated (i.e., separated) into discrete charge trapping material portions 504. In other words, remaining portions of the charge trapping material layer 504L constitute the charge trapping material portions 504. Thus, the processing steps of FIGS. 13D and 13E remove portions of the blocking dielectric layer 502L and portions of the charge trapping material layer 504L from each level of the insulating layers 32 as provided in an initial alternating stack (32, 42) from the back side (e.g., through the backside trenches 79 and through the backside cavities 33).

Figure 13F:
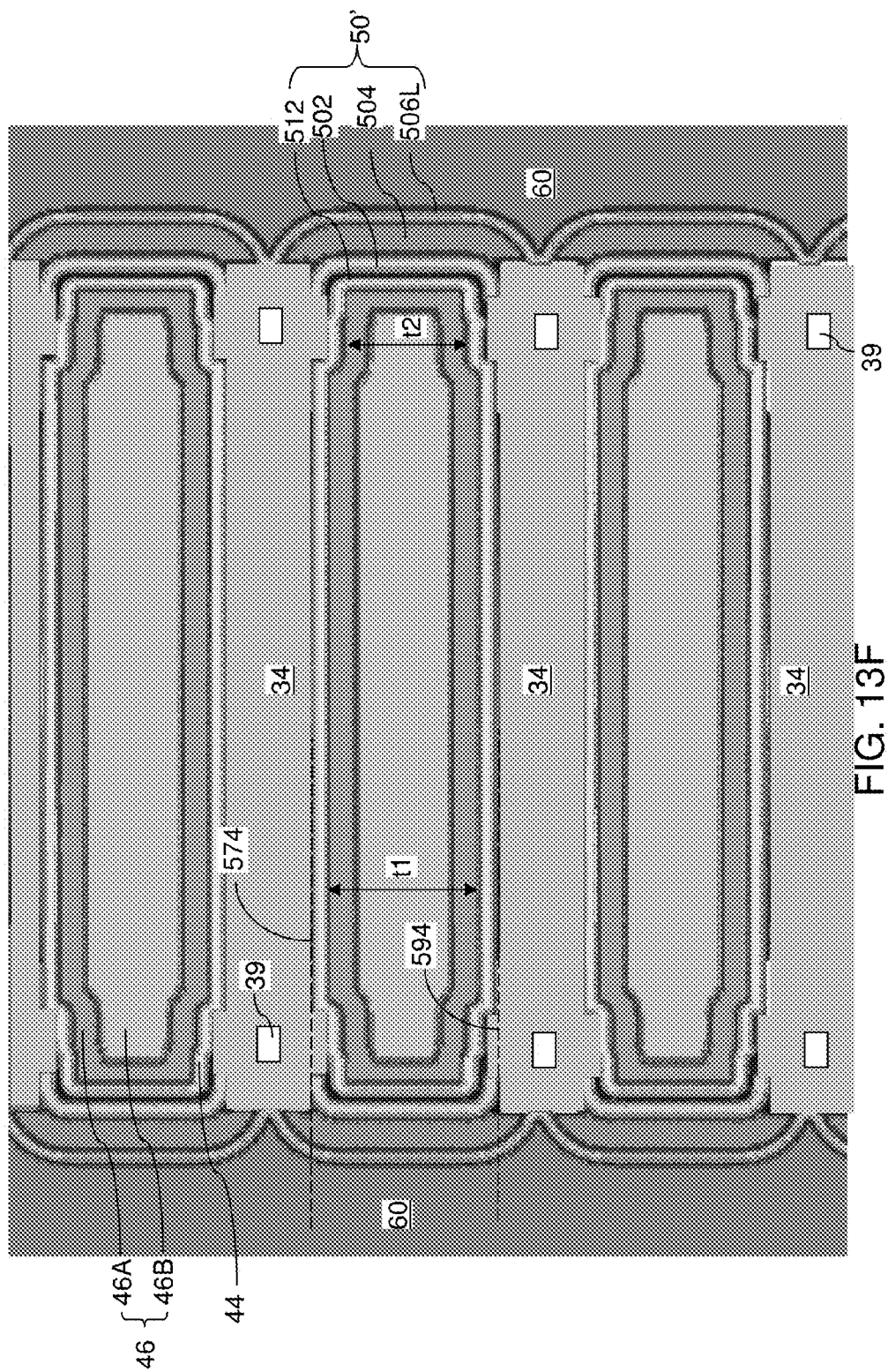
FIG. 13F is a vertical cross-sectional view of the alternating stack after formation of replacement insulating material layers with cavities therein according to an embodiment of the present disclosure.

Referring to FIG. 13F, the backside cavities 33 may be optionally filled with a replacement insulating material, i.e., an insulating material that replaced the first material of the insulating layers 32 as provided in the initial alternating stack (32, 42). Replacement insulating material layers 34 can be formed in volumes of the backside cavities 33. In one embodiment, the vertical steps that are present at end portions of the electrically conductive layers 46 can cause formation of cavities (e.g., air gaps) 39 at peripheral portions of the replacement insulating material layers 34.

An etch process can be performed to remove the material of the replacement insulating material layers 34 from within the backside trenches 79. In one embodiment, each of the charge trapping material portions 504 can have a greater vertical extent than the maximum vertical extent of a sacrificial material layer 42 located at the same level. For example, each of the charge trapping material portions 504 can vertically extend above a first horizontal plane 574 including a bottom surface of an overlying replacement insulating material layer 34 (which is an insulating layer), and vertically extend below a second horizontal plane 594 including a top surface of an underlying replacement insulating material layer 34 (which is an insulating layer).

The resulting structure can be substantially the same as the exemplary structure of FIG. 9 with the difference of replacement of the insulating layers 32 with the replacement insulating material layers 34. The processing steps of FIGS. 10 and 11 can be subsequently performed to complete the memory device.

Figure 14A:
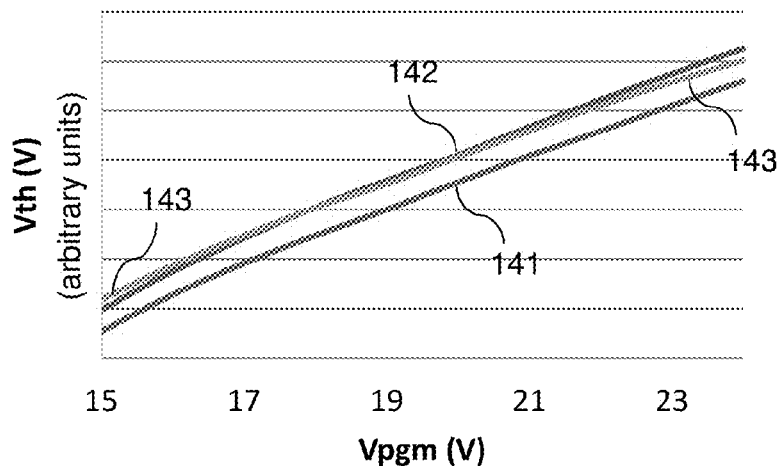
FIGS. 14A and 14B are graphs comparing programming efficiency and threshold voltage interference for devices of the present disclosure with reference devices.
Figure 14B:
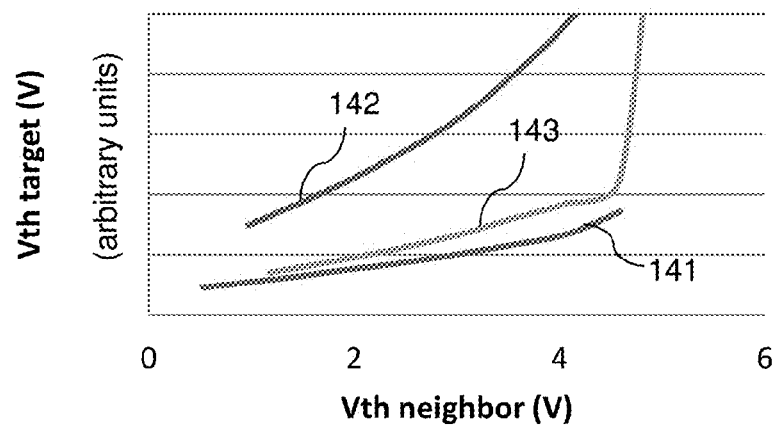

FIGS. 14A and 14B are graphs comparing simulated programming efficiency and threshold voltage interference for devices of the present disclosure with reference devices. FIG. 14A shows the programming efficiency as a function of the programming voltage (Vpgm) as measured by the threshold voltage (Vth) required for sensing the programmed state. FIG. 14B shows variation of the threshold voltage at a given target cell (Vthtarget) as a function of the threshold voltage of a neighboring cell. Curves 141 correspond to the structures of FIGS. 3Q and 3R of the present disclosure, curves 142 correspond to structures where the charge trapping material portions are embodied as portions within a continuous charge trapping material layer, and curves 143 correspond to an ideal structure in which all charge trapping material portions are rectangles and no waviness results in the channel. These figures show a significant decrease in neighboring cell interference for structures with isolated, discreet silicon nitride charge trapping regions (i.e., lines 141 and 143) for each cell compared to a device with a continuous silicon nitride charge trapping layer (i.e., line 142) for all cells in a NAND string. The programming efficiency/speed is about the same for lines 142 and 143, with only a small reduction (about 0.5V) for line 141, According to various embodiments of the present disclosure, a structure is provided, which includes: an alternating stack of insulating layers (32 or 34) and electrically conductive layers 46 located over a substrate 10; and a memory stack structure (50, 50L, or 50') extending through the alternating stack and comprising memory elements laterally surrounding a vertical semiconductor channel 60. Each of the memory elements comprise, from outside to inside, a blocking dielectric portion (502 or portions of 502L), a charge trapping material portion 504 comprising silicon nitride, and a tunneling dielectric portion (506 or portions of 506L). Each of the charge trapping material portions 504 is vertically spaced from one another, and does not contact any other of the charge trapping material portions 504.

In one embodiment, each of the blocking dielectric portions (502, 512) is vertically spaced from one another, and does not contact any other of the blocking dielectric portions (502, 512) as illustrated in FIG. 2L and in FIG. 13F. In one embodiment, each of the tunneling dielectric portions 506 is vertically spaced from one another, and does not contact any other of the tunneling dielectric portions 506 as illustrated in FIG. 2L. Each of the charge trapping material portions can contact a bottom surface of a respective overlying insulating layer 32 and a top surface of a respective underlying insulating layer 32 as illustrated in FIG. 2L. In one embodiment, an inner sidewall of each of the charge trapping material portions 504 facing the channel is laterally offset outward away from the channel with respect to sidewalls of the insulating layers 32 located around the vertical semiconductor channel as illustrated in FIG. 2L. In an embodiment, portions 504 are thicker at their top and bottom than at their middle.

In one embodiment, the tunneling dielectric portions can be material portions within a continuous tunneling dielectric layer 506 that extends through the alternating stack as illustrated in FIG. 3Q and FIG. 13F.

In one embodiment, each of the charge trapping material portions 504 can contact a sidewall surface of a respective overlying insulating layer 34 and a sidewall surface of a respective underlying insulating layer 34 as illustrated in FIG. 13F. In one embodiment, an inner sidewall of each of the charge trapping material portions 504 can be laterally offset inward toward the vertical semiconductor channel 60 with respect to sidewalls of the insulating layers (32 or 34) located around the vertical semiconductor channel 60 as illustrated in FIG. 3Q and FIG. 13F.

In one embodiment, a first electrically conductive layer among the electrically conductive layers 46 includes a bulk portion having a first thickness t1, an end portion that contacts a respective blocking dielectric portion (502, 512) and having a second thickness t2 that is less than the first thickness t1, as shown in FIG. 13F. In one embodiment, a first insulating layer among the insulating layers 32 underlies the first electrically conductive layer, includes a cavity 39 that is devoid of any solid material therein. The cavity 39 can be located underneath the end portion and does not extend to any area underlying the bulk portion of layer 46. Depending on the nature of the gapfill process employed to fill the cavity 39, a large air gap located between a pair of electrically conductive layers 46 may be formed.

In one embodiment, the blocking dielectric portions can be material portions within a continuous blocking dielectric layer 502L that extends through the alternating stack as illustrated in FIG. 3Q. In one embodiment, the tunneling dielectric portions can be material portions within a continuous tunneling dielectric layer 506L that extends through the alternating stack as illustrated in FIG. 3Q. In one embodiment, the blocking dielectric layer 502L undulates inward toward the channel at each level of the insulator layers 32 and undulates outward away from the channel at each level of the electrically conductive layers 46 as illustrated in FIG. 3Q. In one embodiment, each of the charge trapping material portions 504 comprises a sidewall having a vertical center portion, a tapered upper portion, and a tapered lower portion as illustrated in FIGS. 3N-3R.

In one embodiment, the blocking dielectric portions comprise a material selected from silicon oxide and silicon oxynitride, and the tunneling dielectric portions comprise a material selected from silicon oxide and silicon oxynitride.

In one embodiment, the structure comprises a vertical NAND device located in a device region 100, and the electrically conductive layers 46 comprise, or are electrically connected to a respective word line of the vertical NAND device. The device region 100 can comprise: a plurality of semiconductor channels, wherein at least one end portion (such as a vertical semiconductor channel 60) of each of the plurality of semiconductor channels extends substantially perpendicular to a top surface of the substrate 10; a plurality of charge storage regions (as embodied as the charge trapping material portions 504) such that each charge storage region located adjacent to a respective one of the plurality of vertical semiconductor channels; and a plurality of control gate electrodes (as embodied as end portions of the electrically conductive layers 46) having a strip shape extending substantially parallel to the top surface of the substrate. The plurality of control gate electrodes can comprise at least a first control gate electrode located in a first device level and a second control gate electrode located in a second device level; the electrically conductive layers 46 in the stack can be in electrical contact with the plurality of control gate electrode and extend from the device region to a contact region including the plurality of electrically conductive via connections (as embodied as a plurality of word line contact via structures 84 illustrated in FIGS. 11A and 11B); and the substrate 10 can comprise a silicon substrate containing a driver circuit for the NAND device.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A structure comprising:
    an alternating stack of insulating layers and electrically conductive layers located over a substrate; and
    a memory stack structure extending through a memory opening in the alternating stack and comprising memory elements laterally surrounding a vertical semiconductor channel, wherein:
        each of the memory elements comprise, from outside to inside, a blocking dielectric portion that is a region of a continuous blocking dielectric layer, a charge trapping material portion having a vertical sidewall portion and comprising silicon nitride, and a tunneling dielectric portion that is a region of a continuous tunneling dielectric layer directly contacting the continuous blocking dielectric layer, wherein a continuous interface between the continuous blocking dielectric layer and the alternating stack vertically extends through multiple electrically conductive layers of the alternating stack, and a continuous interface between the continuous tunneling dielectric layer and the vertical semiconductor channel vertically extends through the multiple electrically conductive layers of the alternating stack;
        each of the insulating layers includes an upper recessed annular rim, a lower recessed annular rim, and an annular center portion located between the upper and lower recessed annular rims, wherein the annular center portion protrudes inward toward a vertical axis of the memory opening relative to the upper and lower recessed rims; and
        each of the charge trapping material portions is vertically spaced from one another, and does not contact any other of the charge trapping material portions.

2. The structure of claim 1, wherein the tunneling dielectric portions are material portions within the continuous tunneling dielectric layer that extends through the alternating stack.

3. The structure of claim 1, wherein:
    the structure comprises a vertical NAND device located in a device region; and
    the electrically conductive layers comprise, or are electrically connected to a respective word line of the vertical NAND device.

4. The structure of claim 3, wherein:
    the device region comprises:
        a plurality of vertical semiconductor channels, wherein at least one end portion of each of the plurality of vertical semiconductor channels extends substantially perpendicular to a top surface of the substrate;
        a plurality of charge storage regions, each charge storage region located adjacent to a respective one of the plurality of vertical semiconductor channels; and
        a plurality of control gate electrodes having a strip shape extending substantially parallel to the top surface of the substrate;
    the plurality of control gate electrodes comprise at least a first control gate electrode located in a first device level and a second control gate electrode located in a second device level;
    the electrically conductive layers in the stack are in electrical contact with the plurality of control gate electrode and extend from the device region to a contact region including the plurality of electrically conductive via connections; and
    the substrate comprises a silicon substrate containing a driver circuit for the NAND device.

5. The structure of claim 1, wherein each of the charge trapping material portions is vertically spaced from one another by a respective interface between the continuous tunneling dielectric layer and the continuous blocking dielectric layer.

6. The structure of claim 5, wherein the interfaces between the continuous tunneling dielectric layer and the continuous blocking dielectric layer are located at levels of the insulating layers.

7. The structure of claim 1, wherein:
    the continuous blocking dielectric layer undulates inward toward the vertical semiconductor channel at each level of the insulator layers; and
    undulates outward away from the vertical semiconductor channel at each level of the electrically conductive layers.

8. The structure of claim 7, wherein:
    each of the charge trapping material portions comprises a sidewall having the vertical portion which comprises a vertical center portion, a tapered upper portion, and a tapered lower portion;

the vertical center portion has a uniform thickness; and the tapered upper portion and the tapered lower portion has a tapered thickness that decreases with distance from the vertical center portion.

9. The structure of claim 1, wherein the vertical sidewall portion is a straight portion which extends vertically.

10. The structure of claim 1, wherein the continuous tunneling dielectric layer comprises an ONO stack.

11. The structure of claim 1, wherein the continuous blocking dielectric layer comprises aluminum oxide that directly contacts the charge trapping material portions.

12. The structure of claim 1, wherein:
the continuous blocking dielectric layer comprises silicon oxynitride; and
the continuous tunneling dielectric layer consists essentially of silicon oxide.

13. The structure of claim 1, wherein:
the continuous blocking dielectric layer consists essentially of silicon oxide; and
the continuous tunneling dielectric layer consists essentially of silicon oxynitride.

14. The structure of claim 1, wherein:
the continuous blocking dielectric layer consists essentially of silicon oxide, silicon oxynitride, or a combination of silicon oxide and silicon oxynitride; and
the continuous tunneling dielectric layer comprises a dielectric metal oxide.

15. The structure of claim 1, wherein:
an outer sidewall of the continuous blocking dielectric layer directly contacts each of the insulating layers in the alternating stack;
the outer sidewall of the continuous blocking dielectric layer includes vertical sidewall portions at each level of the electrically conductive layers; and
the vertical sidewall portions of the continuous blocking dielectric protrude inward toward the vertical axis of the memory opening relative to portions of the outer sidewall of the continuous blocking dielectric layer that contact the upper and lower recessed rims.

16. The structure of claim 15, wherein horizontal surface portions of the outer sidewall of the continuous blocking dielectric layer adjoined to the portions of the outer sidewall of the continuous blocking dielectric layer that contact the upper and lower recessed rims directly contact peripheral portions of top surfaces of the electrically conductive layers and peripheral portions of bottom surfaces of the electrically conductive layers.

17. The structure of claim 15, wherein:
the electrically conductive layers are vertically spaced from an overlying insulating layer and from an underlying insulating layer by a backside blocking dielectric layer, and is laterally spaced from the continuous blocking dielectric layer by the backside blocking dielectric layer; and
wherein horizontal surface portions of the outer sidewall of the continuous blocking dielectric layer adjoined to the portions of the outer sidewall of the continuous blocking dielectric layer that contact the upper and lower recessed rims directly contact peripheral portions of horizontal surfaces of the backside blocking dielectric layer.

* * * * *